(12) United States Patent
Jeong et al.

(10) Patent No.: US 10,674,623 B2
(45) Date of Patent: Jun. 2, 2020

(54) HOUSING INCLUDING METAL MATERIAL AND ELECTRONIC DEVICE INCLUDING SAME

(71) Applicant: Samsung Electronics Co., Ltd., Gyeonggi-do (KR)

(72) Inventors: Hyunjung Jeong, Gyeonggi-do (KR); Youngsoo Jang, Gyeonggi-do (KR); Yunsung Ha, Gyeonggi-do (KR); Yongwook Hwang, Gyeonggi-do (KR); Changyoun Hwang, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/522,896

(22) Filed: Jul. 26, 2019

(65) Prior Publication Data

US 2020/0037460 A1    Jan. 30, 2020

(30) Foreign Application Priority Data

Jul. 27, 2018 (KR) .......................... 10-2018-0087982

(51) Int. Cl.
*H04M 1/02* (2006.01)
*H01M 2/10* (2006.01)
(Continued)

(52) U.S. Cl.
CPC ............. *H05K 7/02* (2013.01); *G06F 1/1635* (2013.01); *G06F 1/188* (2013.01); *H01M 2/1066* (2013.01); *H04M 1/0262* (2013.01)

(58) Field of Classification Search
CPC ......... H05K 7/02; G06F 1/1635; G06F 1/188; H04M 1/0262; H04M 2/1066
See application file for complete search history.

(56) References Cited

U.S. PATENT DOCUMENTS 3,614,544 A * 10/1971 Mosebach ............ H01G 9/0032
361/524
5,286,306 A *  2/1994 Menezes ............... H01L 31/032
136/249
(Continued)

FOREIGN PATENT DOCUMENTS

CN       103009705 A       4/2013
CN       107587108 A       1/2018
(Continued)

OTHER PUBLICATIONS

International Search Report dated Nov. 21, 2019.
European Search Report dated Dec. 18, 2019.

*Primary Examiner* — Adrian S Wilson
(74) *Attorney, Agent, or Firm* — Cha & Reiter, LLC

(57) ABSTRACT

A device, a house for the device and a method are disclosed herein. The device includes a first plate, a second plate facing an opposite direction, a side member integrally formed with the second plate, surrounding a space between the first the second plate, and a mid-plate coupled to the side member, extending into the space, the side member further including an aluminum substrate layer formed between a first and second surface exposed within the space, an aluminum oxide layer formed between the first surface and the aluminum substrate layer including multiple pores, a first layer formed conformally between the first surface and the aluminum oxide layer along the multiple pores and a surface of the aluminum oxide layer, the first layer comprising titanium, and a second layer formed on the first layer as to form the first surface, the second layer comprising titanium.

20 Claims, 20 Drawing Sheets

(51) Int. Cl.
*H05K 7/02* (2006.01)
*G06F 1/16* (2006.01)
*G06F 1/18* (2006.01)

(56) References Cited

U.S. PATENT DOCUMENTS

| | | | |
|---|---|---|---|
| 9,882,275 B2 * | 1/2018 | Rubin | H01Q 21/28 |
| 9,896,777 B2 * | 2/2018 | Evans, V | B32B 7/12 |
| 10,034,402 B2 | 7/2018 | Kiple et al. | |
| 10,158,164 B2 * | 12/2018 | Gagne-Keats | B32B 7/12 |
| 2008/0063218 A1 * | 3/2008 | Weber | H04R 1/02 |
| | | | 381/87 |
| 2008/0138248 A1 * | 6/2008 | Viovy | B01L 3/502707 |
| | | | 422/400 |
| 2009/0190290 A1 * | 7/2009 | Lynch | H05K 5/0086 |
| | | | 361/679.01 |
| 2010/0008030 A1 * | 1/2010 | Weber | C25D 11/16 |
| | | | 361/679.02 |
| 2014/0284096 A1 | 9/2014 | Wu et al. | |
| 2015/0167193 A1 | 6/2015 | Demers | |
| 2016/0251749 A1 | 9/2016 | Wu et al. | |
| 2018/0072021 A1 | 3/2018 | Weber et al. | |
| 2018/0084653 A1 | 3/2018 | Misra et al. | |
| 2018/0299924 A1 | 10/2018 | Seo et al. | |

FOREIGN PATENT DOCUMENTS

| | | |
|---|---|---|
| CN | 206993173 U | 2/2018 |
| KR | 10-2010-0025502 A | 3/2010 |
| KR | 10-2015-0017742 A | 2/2015 |
| KR | 10-2017-0070636 A | 6/2017 |

\* cited by examiner

HOUSING INCLUDING METAL MATERIAL AND ELECTRONIC DEVICE INCLUDING SAME

CROSS-REFERENCE TO RELATED APPLICATION(S)

This application is based on and claims priority under 35 U.S.C. 119 to Korean Patent Application No. 10-2018-0087982, filed on Jul. 27, 2018, in the Korean Intellectual Property Office, the disclosure of which is herein incorporated by reference in its entirety.

BACKGROUND

1) Field

Disclosed certain embodiments relate to a housing including a metal material and an electronic device including the same.

2) Description of Related Art

The above information is presented as background information only to assist with an understanding of the disclosure. No determination has been made, and no assertion is made, as to whether any of the above might be applicable as prior art with regard to the disclosure.

Development of electronic devices has enabled application thereof to various fields closely related to our daily lives. Such electronic devices have been commercialized in various sizes according to functions and user preferences. Besides the functions and slimness of the devices, aesthetic appearances are also considered. Even if two electronic devices have substantially the same functions, users tend to prefer devices that have more excellent and aesthetic designs and are thus more differentiated.

The exterior of the device includes a housing made of a metal material, which has a deposition layer formed thereon in order to provide various textures and colors to the user. The color of deposition layers may be variously formed and, since the same can provide a metal texture, the same may be variously used to form the exterior of housings.

The functional gap between respective manufacturers has recently been reduced remarkably, and increasing efforts are being made in design aspects. In line with such a trend, various structures (for example, housings) of electronic devices are implemented by metal materials so as to make the electronic devices highly regarded.

SUMMARY

An electronic device may have a housing made of a metal material that is relatively light and has excellent rigidity. In addition, the housing may include at least one deposited layer (hereinafter, referred to as deposition layer) for the purpose of resistance to corrosion, resistance to wear, and aesthetic appearance. Accordingly, there is a demand for a technology for firmly bonding metal members and deposition layers.

Various embodiments may provide a housing including a metal material so as to increase the coupling power (also referred to as bond strength or bonding strength) between a metal member and a deposition layer included in the housing, and an electronic device including the same.

An electronic device according to certain embodiments may include: a first plate; a second plate facing an opposite direction relative to the first plate; a side member coupled to or integrally formed with the second plate, the side member surrounding a space between the first plate and the second plate; and a mid-plate coupled to or integrally formed with the side member, the mid-plate extending into the space, wherein the side member further comprises: an aluminum substrate layer formed between a first surface forming a part of an outer surface of the electronic device and a second surface exposed within the space, an aluminum oxide layer formed between the first surface and the aluminum substrate layer, the aluminum oxide layer comprising multiple pores extending in a direction substantially perpendicular to the first surface, a first layer formed conformally between the first surface and the aluminum oxide layer along the multiple pores and a surface of the aluminum oxide layer, the first layer comprising titanium, and a second layer formed on the first layer as to form the first surface, the second layer comprising titanium.

A housing according to certain embodiments may include: a plate forming a surface of the housing; and a side member arranged along a periphery of the plate so as to form a side surface of the housing, the side member comprising a mid-plate extending from the side surface to an interior space defined at least partly by the plate, wherein the side member comprises: a nonconductive member forming a first part of the side member, a substrate layer forming a second part of the side member, the substrate layer formed of an anodizable metal; an anodizing coating layer including multiple irregular pores formed by oxidation of at least a partial surface of the substrate layer; a bonding layer formed along a surface of the anodizing coating layer, the surface comprising the multiple irregular pores; and a deposition layer deposited on the bonding layer so as to fill the multiple irregular pores.

An electronic device or a housing including a metal material according to certain embodiments may have increased bond strength between a deposition layer and an anodizing coating and may have a reduced delaminating phenomenon such that the exterior of the product can be maintained for a long time.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
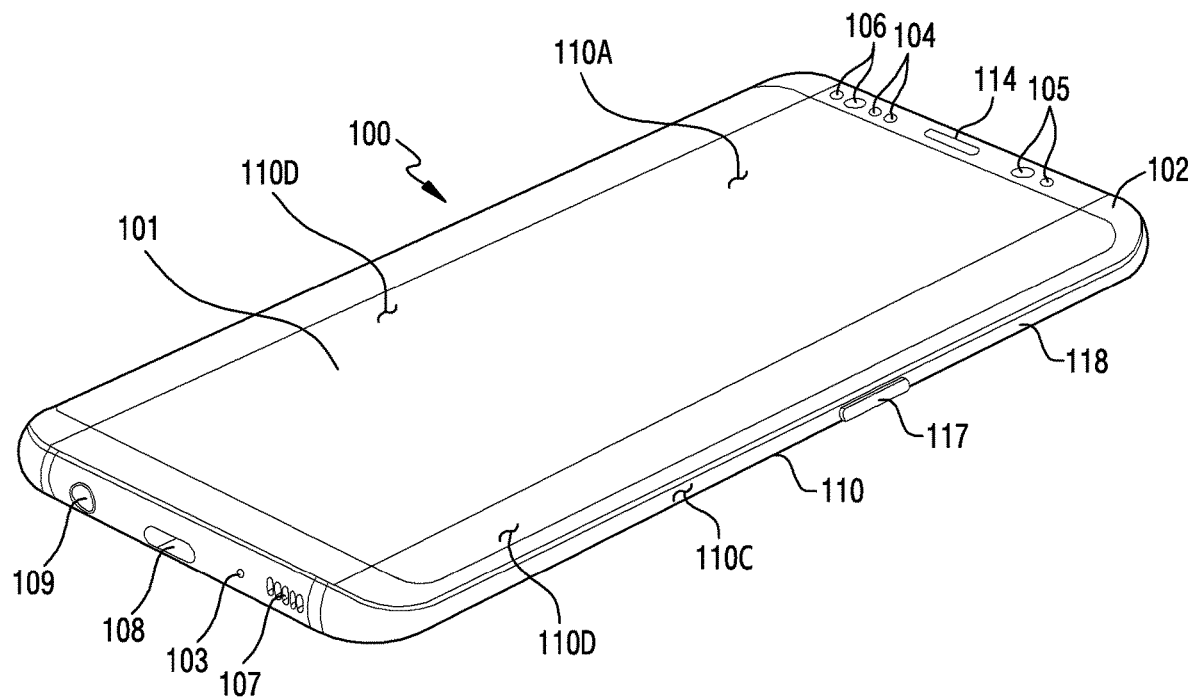
FIG. 1 is a front perspective view of a mobile electronic device according to an embodiment.

FIG. 1 is a front perspective view of a mobile electronic device according to an embodiment.

Figure 2:
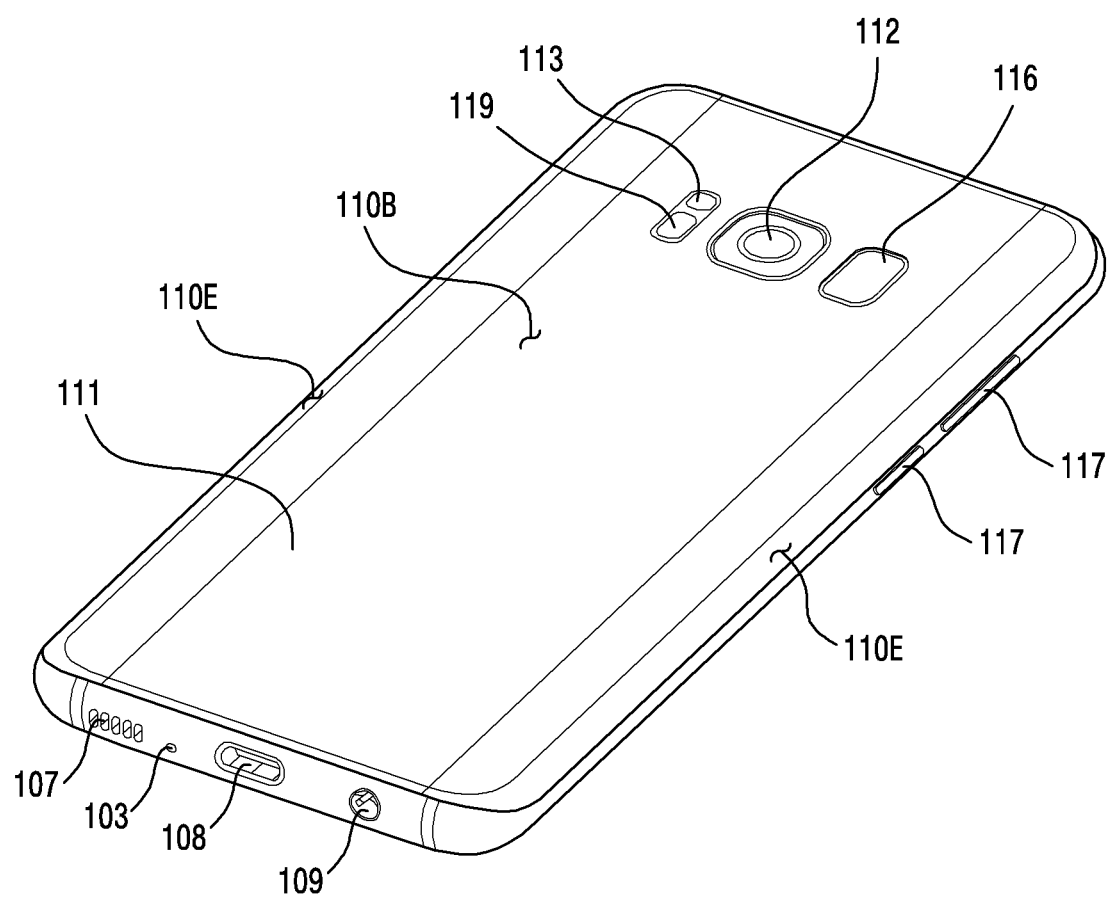
FIG. 2 is a rear perspective view of the electronic device according to an embodiment illustrated in FIG. 1.

FIG. 2 is a rear perspective view of the electronic device according to an embodiment illustrated in FIG. 1.

Referring to FIGS. 1 and 2, an electronic device 100 according to an embodiment may include a housing 110 including a first face (or a front face) 110A, a second face (or a rear face) 110B, and a side face 110C surrounding a space between the first face 110A and the second face 110B. In another embodiment (not shown), the housing may refer to a structure which forms part of the first face 110A, second face 110B, and side face 110C of FIG. 1. According to an embodiment, the first face 110A may be formed of a front plate 102 (e.g., a polymer plate or a glass plate having various coating layers) which is at least partially transparent. The second face 110B may be formed of a rear plate 111 which is substantially opaque. For example, the rear plate 111 may be formed of coated or colored glass, ceramic, polymer, metallic materials (e.g. aluminum, stainless steel (STS), or magnesium) or a combination of at least two of these materials. The side face 110C may be formed of a side bezel structure (or a side member) 118 bonded to the front plate 102 and the rear plate 111 and including metal and/or polymer. In some embodiments, the rear plate 111 and the side bezel structure 118 may be formed integrally and may include the same material (e.g., a metallic material such as aluminum).

In the illustrated embodiment, the front plate 102 may include two first regions 110D seamlessly extended by being bent from the first face 110A toward the rear plate 111 at both ends of a long edge of the front plate 102. In the illustrated embodiment (see FIG. 2), the rear plate 111 may include two second regions 110E seamlessly extended by being bent from the second face 110B toward the front plate 102 at both ends of a long edge. In some embodiments, the front plate 102 (or the rear plate 111) may include one of the first regions 110D (or the second regions 110E). In another embodiment, some of the first regions 110D or the second region 110E may not be included. In the above embodiments, in a side view of the electronic device 100, the side bezel structure 118 may have a first thickness (or width) at a side in which the first regions 110D or the second regions 110E is not included, and may have a second thickness thinner than the first thickness at a side in which the first regions 110D or the second regions 110E is included.

According to an embodiment, the electronic device 100 may include at least one of a display 101, audio modules 103, 107, and 114, sensor modules 104, 116, and 119, camera modules 105, 112, and 113, a key input device 117, a light emitting element 106, and connector holes 108 and 109. In some embodiments, the electronic device 100 may omit at least one of components (e.g., the key input device 117 or the light emitting element 106), or other components may be additionally included.

The display 101 may be exposed through, for example, some portions of the front plate 102. In some embodiments, at least part of the display 101 may be exposed through the first face 110A and the front plate 102 constructing the first regions 110D of the side face 110C. In some embodiments, a corner of the display 101 may be formed to be substantially identical to an adjacent outer perimeter of the front plate 102. In another embodiment (not shown), a spacing between an outer perimeter of the display 101 and the outer perimeter of the front plate 102 may be formed to be substantially identical in order to enlarge an area to which the display 101 is exposed.

In another embodiment (not shown), a recess or opening may be formed in part of a screen display region of the display 101, and at least one of the audio module 114, the sensor module 104, and the camera module 105, and the light emitting element 106 may be included, which are aligned with the recess or the opening. In another embodiment (not shown), at least one of the audio module 114, the sensor module 104, the camera module 105, the sensor 116 (i.e., fingerprint sensor), and the light emitting element 106 may be included in a rear face of the screen display region of the display 101. In another embodiment (not shown), the display 101 may be disposed adjacent to or bonded to a touch sensing circuit, a pressure sensor capable of measuring touch strength (pressure), and/or a digitizer for detecting a magnetic-type stylus pen. In some embodiments, at least part of the sensor modules 104 and 119 and/or at least part of the key input device 117 may be disposed to the first regions 110D and/or the second regions 110E.

The audio modules 103, 107, and 114 may include the microphone hole (i.e., audio module 103) or the speaker holes (i.e., audio modules 107 and 114). A microphone for acquiring external sound may be disposed inside the microphone hole (i.e., audio module 103). In some embodiments, a plurality of microphones may be disposed to detect a direction of the sound. The speaker holes (i.e., audio modules 107 and 114) may include the external speaker hole (i.e., audio module 107) and the receiver hole (i.e., audio module 114) for a call. In some embodiments, the speaker holes (i.e., audio modules 107 and 114) and the microphone hole (i.e., audio module 103) may be implemented as one hole, or a speaker (e.g., a Piezo speaker) may be included without the speaker holes (i.e., audio modules 107 and 114).

The sensor modules 104, 116, and 119 may generate an electrical signal or data value corresponding to an internal operational state of the electronic device 100 or an external environmental state. The sensor modules 104, 116, and 119 may include, for example, the first sensor module 104 (e.g., a proximity sensor) and/or second sensor module (not shown) (e.g., a fingerprint sensor) disposed to the first face 110A of the housing 110, and/or the third sensor module 119

(e.g., a heart rate monitoring (HRM) sensor) disposed to the second face 110B of the housing 110 and/or the sensor module 116 (e.g., a fingerprint sensor). The fingerprint sensor may be disposed not only to the first face 110A but also the second face 110B of the housing 110. The electronic device 100 may further include at least one of sensor modules (not shown), for example, a gesture sensor, a gyro sensor, an atmospheric pressure sensor, a magnetic sensor, an acceleration sensor, a grip sensor, a color sensor, an IR sensor, a biometric sensor, a temperature sensor, a humidity sensor, and an illuminance sensor.

The camera modules 105, 112, and 113 may include the first camera module 105 disposed to the first face 110A of the electronic device 100, the second camera module 112 disposed to the second face 110B, and/or the flash (i.e., camera module 113). The camera module 105 and 112 may include one or more lenses, an image sensor, and/or an image signal processor. The flash (i.e., camera module 113) may include, for example, a light emitting diode (LED) or a xenon lamp. In some embodiments, two or more lenses (infrared cameras, wide angle and telephoto lenses) and image sensors may be disposed to one face of the electronic device 100.

The key input device 117 may be disposed to the side face 110C of the housing 110. In another embodiment, the electronic device 100 may not include some or all of the aforementioned key input device 117. The key input device 117, which are not included, may be implemented on a display 101 in a different form such as a soft key or the like. In some embodiments, the key input device may include the sensor module 116 disposed to the second face 110B of the housing 110.

The light emitting element 106 may be disposed to, for example, the first face 110A of the housing 110. The light emitting element 106 may provide, for example, status information of the electronic device 100 in an optical form. In another embodiment, the light emitting element 106 may provide, for example, a light source interworking with an operation of the camera module 105. The light emitting element 106 may include, for example, an LED, an IR LED, and a xenon lamp.

The connector holes 108 and 109 may include the first connector hole 108 capable of accommodating a connector (e.g., a USB connector) for transmitting/receiving power and/or data of an external electronic device and/or the second connector hole (e.g., earphone jack) 109 capable of accommodating a connector for transmitting/receiving an audio signal with respect to the external electronic device.

Figure 3:
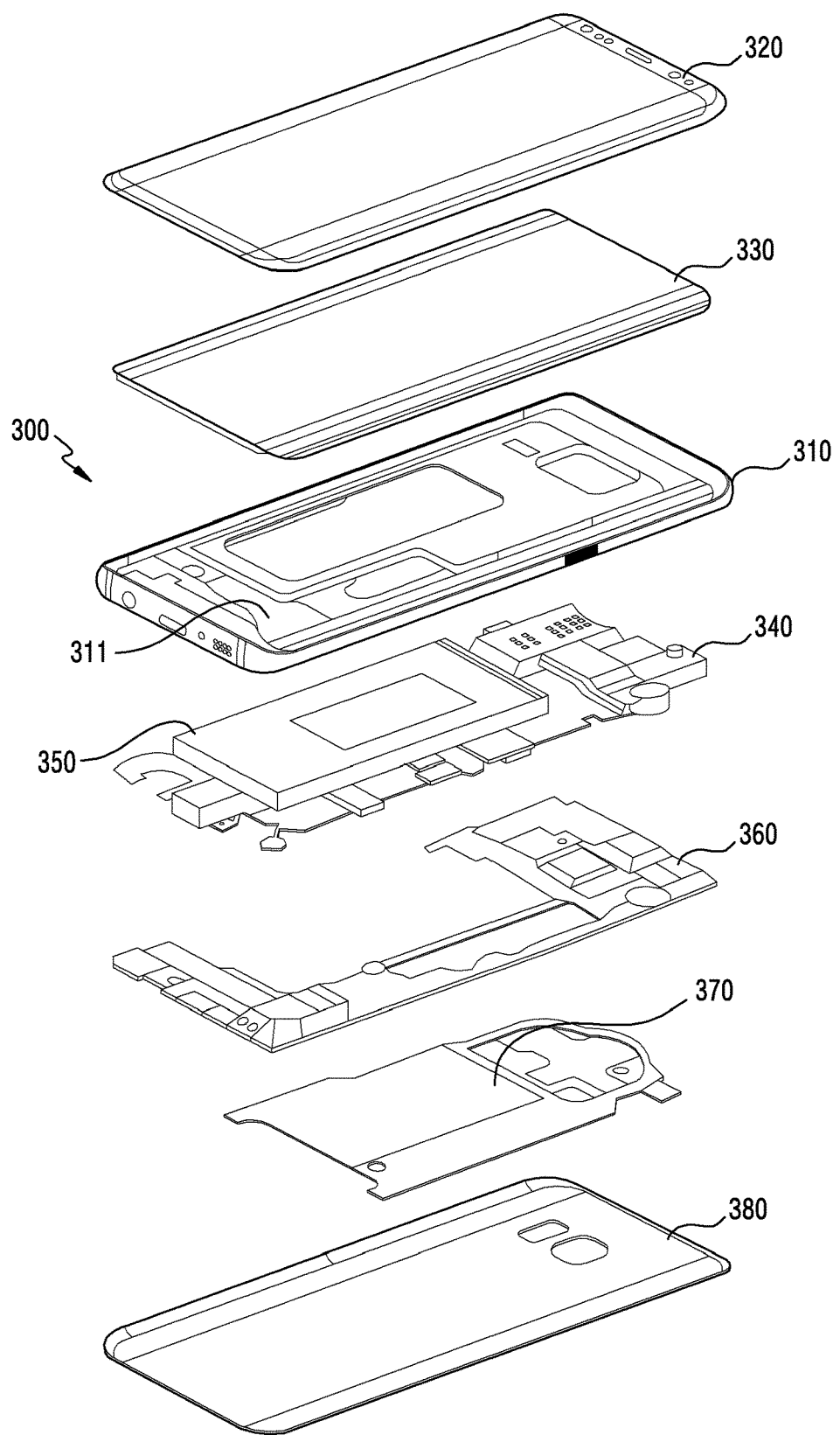
FIG. 3 is an exploded perspective view of the electronic device according to an embodiment illustrated in FIG. 1.

FIG. 3 is an exploded perspective view of the electronic device according to an embodiment illustrated in FIG. 1.

Referring to FIG. 3, an electronic device 300 may include a side bezel structure 310, a first support member 311 (e.g., a bracket), a front plate 320, a display 330, a PCB 340, a battery 350, a second support member 360 (e.g., a rear case), an antenna 370, and a rear plate 380. In some embodiments, the electronic device 300 may omit at least one (e.g., the first support member 311 or the second support member 360) of these components, or may additionally include other components. At least one of the components of the electronic device 300 may be the same as or similar to at least one of the components of the electronic device 100 of FIG. 1 or 2, and redundant descriptions will be omitted hereinafter.

A first support member 311 may be coupled with the side bezel structure 310 by being disposed inside the electronic device 300, or may be integrated with the side bezel structure 310. The first support member 311 may be formed of, for example, a metal material and/or a non-metal (e.g., polymer) material. The first support member 311 may have the display 330 coupled to one face and the PCB 340 coupled to the other face. A processor, a memory, and/or an interface may be mounted on the PCB 340. The processor may include, for example, one or more of a central processing unit, an application processor, a graphic processing unit, an image signal processor, a sensor hub processor, and a communication processor.

The memory may include, for example, a volatile memory or a non-volatile memory.

The interface may include, for example, a HDMI, a USB interface, an SD card interface, and/or an audio interface. The interface may electrically or physically couple, for example, the electronic device 300 with an external electronic device, and may include a USB connector, an SD card/multimedia card (MMC) connector, or an audio connector.

The battery 350 may be a device for supplying power to at least one component of the electronic device 300, and may include, for example, a primary cell which is not rechargeable, a secondary cell which is rechargeable, or a fuel cell. At least part of the battery 350 may be disposed, for example, to be substantially co-planar with the PCB 340. The battery 350 may be disposed inside the electronic device 300, and according to some embodiments, may be disposed to be detachable from the electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication, for example, with the external electronic device, or may wirelessly transmit/receive power utilized for charging. In another embodiment, an antenna structure may be formed by at least part of the side bezel structure 310 and/or the first support member 311 or a combination thereof.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

Figure 4A:
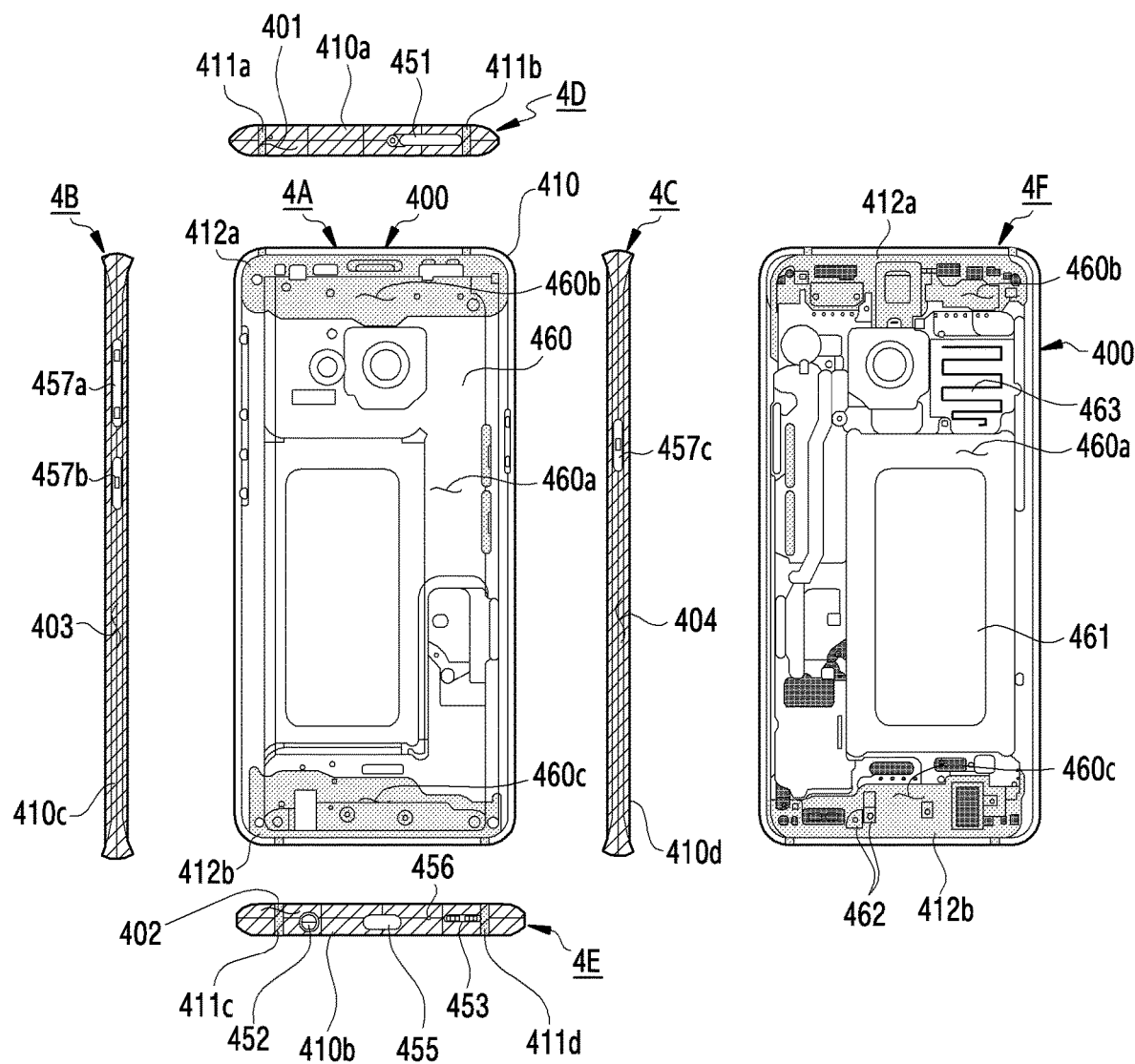
FIG. 4A is a diagram illustrating views of a side member according to an embodiment seen in various directions.
Figure 4B:
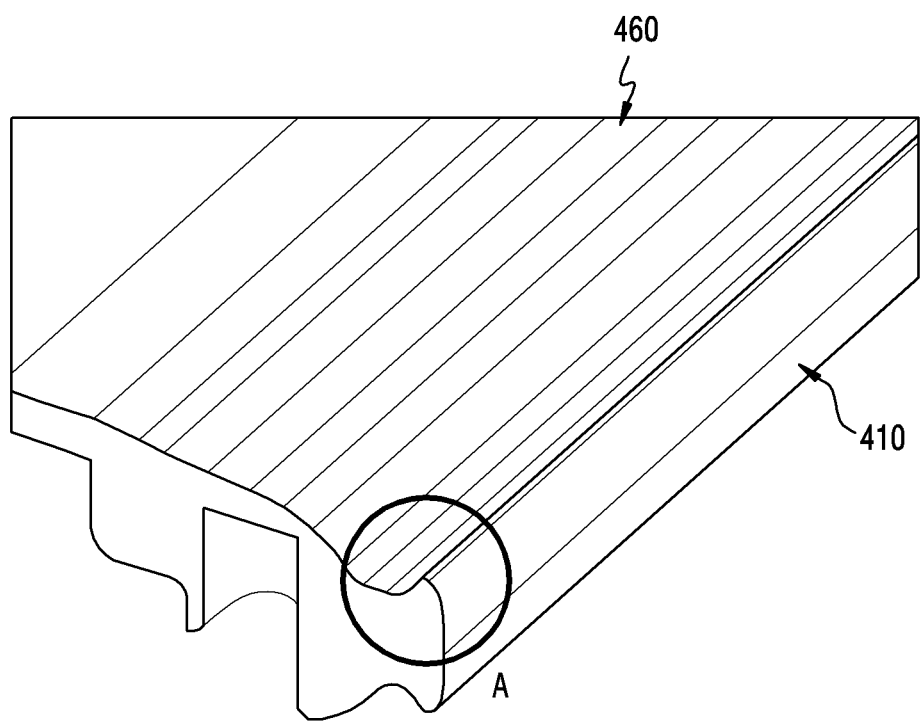
FIG. 4B is a perspective view of a side member according to an embodiment.
Figure 4C:
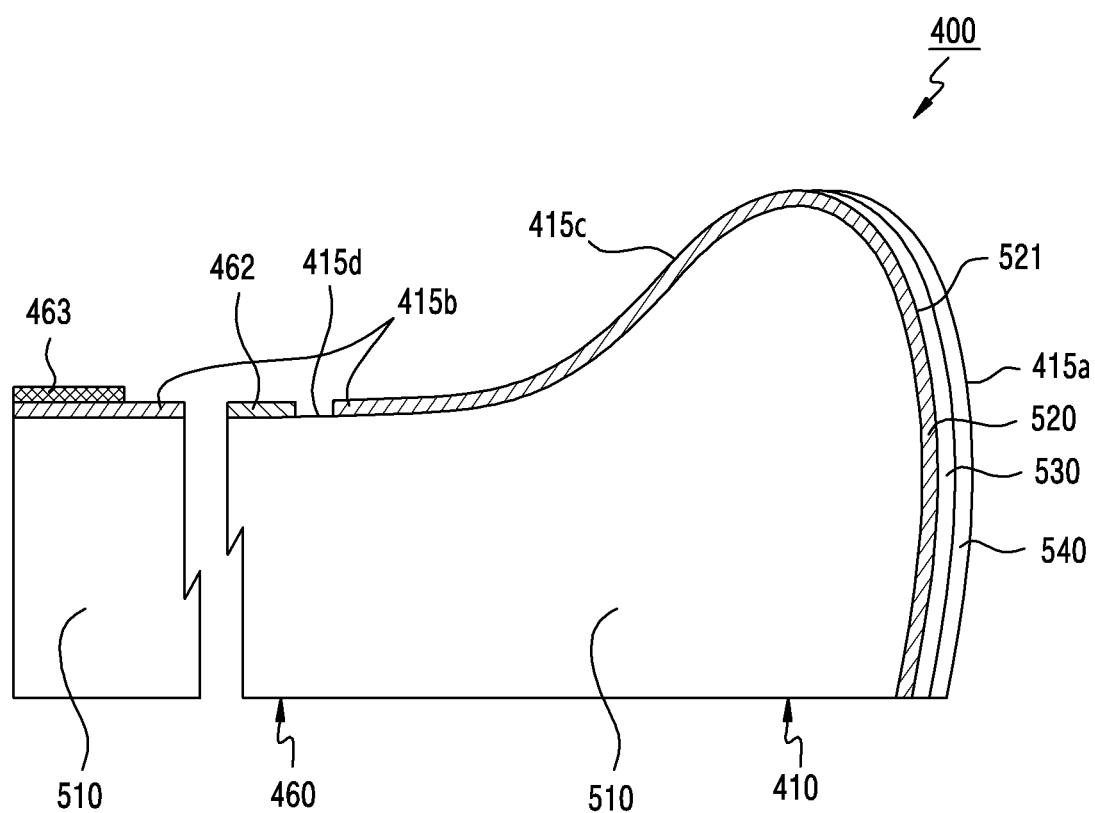
FIG. 4C is a sectional view of part A of the side member illustrated in FIG. 4B.

FIG. 4A is a diagram illustrating views of a side member according to an embodiment seen in various directions. FIG. 4B is a perspective view of a side member according to an embodiment. FIG. 4C is a sectional view of part A of the side member illustrated in FIG. 4B.

Referring to FIG. 4A, reference sign 4A in FIG. 4A denotes the front view of the side member 400. Reference sign 4B in FIG. 4A denotes the left view of the side member 400. Reference sign 4C in FIG. 4A denotes the right view of the side member 400. Reference sign 4D in FIG. 4A denotes the top view of the side member 400. Reference sign 4E in FIG. 4A denotes the bottom view of the side member 400. Reference sign 4F in FIG. 4A denotes the back view of the member 400. In an embodiment, the side member 400 may include a side bezel 410 (for example, the side bezel structure 310 of FIG. 3) and a mid-plate 460 (for example, the first support member 311 of FIG. 3). The side bezel 410 may surround an inner space formed by spacing the front plate (for example, the front plate 102 of FIG. 1) and the rear plate 111 away from each other, and may form a side surface (for example, the side surface 110c of FIG. 1) of the electronic device 100. The mid-plate 460 may be arranged in the space between the front plate 102 and the rear plate 111. The side member 400 may be made of a material that is light and has good resistance to corrosion and good resistance to wear.

According to an embodiment, side surfaces formed by the side bezel 410 may include a first side surface 401, a second side surface 402 facing in the opposite direction to the first side surface 401, a third side surface 403 interconnecting one end of the first side surface 401 and one end of the second side surface 402, and a fourth side surface 404 interconnecting the other end of the first side surface 401 and the other end of the second side surface 402. According to an embodiment, the side bezel 410 may include a first bezel portion 410a forming at least a part of the first side surface 401, a second bezel portion 410b forming at least a part of the second side surface 402, a third bezel portion 410c forming at least another part of the first side surface 401 and at least a part of the third side surface 403, and a fourth bezel portion 410d forming at least another part of the second side surface 402 and at least a part of the fourth side surface 404.

According to an embodiment, the side member 400 may include a first segment portion 411a (for a gap) arranged between the first bezel portion 410a and the third bezel portion 410c, a second segment portion 411b arranged between the first bezel portion 410a and the fourth bezel portion 410d, a third segment portion 411c arranged between the second bezel portion 410b and the third bezel portion 410c, and a fourth segment portion 411d arranged between the second bezel portion 410b and the fourth bezel portion 410d.

According to an embodiment, the distance by which the first segment portion 411a is spaced apart from the third surface 403 in the direction defined from the third surface 403 toward the fourth surface 404 may be substantially identical to the distance by which the second segment portion 411b is spaced apart from the fourth surface 404 in the direction defined from the fourth surface 404 toward the third surface 403. According to an embodiment, the distance by which the third segment portion 411c is spaced apart from the third surface 403 in the direction defined from the third surface 403 toward the fourth surface 404 may be substantially identical to the distance by which the fourth segment portion 411d is spaced apart from the fourth surface 404 in the direction defined from the fourth surface 404 toward the third surface 403.

According to certain embodiments, in the direction defined from the third surface 403 toward the fourth surface 404, the distance by which the first segment portion 411a is spaced apart from the third surface 403 may be substantially identical to the distance by which the third segment portion 411c is spaced apart from the third surface 403. In the direction defined from the fourth surface 404 toward the third surface 403, the distance by which the second segment portion 411b is spaced apart from the fourth surface 404 may be substantially identical to the distance by which the fourth segment portion 411d is spaced apart from the fourth surface 404.

According to certain embodiments, the first segment portion 411a, the second segment portion 411b, the third segment portion 411c, or the fourth segment portion 411d may not be limited to the position illustrated in FIG. 4A. For example, although not illustrated, the first segment portion 411a may be arranged on the third side surface 403, or the second segment portion 411b may be arranged on the fourth side surface 404. For example, although not illustrated, the third segment portion 411c may be arranged on the third side surface 403, or the fourth segment portion 411d may be arranged on the fourth side surface 404. The length or shape of the bezel portions 410a, 410b, 410c, and 410d may vary depending on the position of the segment portions 411a, 411b, 411c, and 411d on the side bezel 410.

According to an embodiment, the side member 400 may include inner structures 412a and 412b made of a polymer material and coupled to the side bezel 410. The inner structures 412a and 412b may be configured such that a part of the side member 400 (for example, the first bezel portion 411a or the second bezel portion 411b) remains separated from the remaining part of the side member 400 physically or electrically. Parts of the inner structures 412a and 412b may be arranged on the first segment portion 411a, the second segment portion 411b, the third segment portion 411c, and the fourth segment portion 411d and exposed to the outside, thereby forming a part of a side surface (for example, 110C of FIG. 1).

According to an embodiment, the first bezel portion 411a or the second bezel portion 411b may be electrically connected to a printed circuit board (for example, 340 of FIG. 3) and used as an antenna constituent element. For example, the first bezel portion 411a or the second bezel portion 411b may be used as an antenna radiator or an antenna ground. According to some embodiments, the first bezel portion 411a and/or the second bezel portion 411b may be configured to remain in an electrically floating state.

According to an embodiment, the mid-plate 460 may include a first area 460a which may be connected to the side bezel 410 (for example, the third bezel portion 410c or the fourth bezel portion 410d), or which is integrally formed with the side bezel 410. The inner structures 412a and 412b may be coupled to the metal plate 460a and to the side bezel 410, and the mid-plate 460 may include second areas 460b and 460c formed by the inner structures 412a and 412b.

Referring to FIG. 4B and FIG. 4C, in an embodiment, the side member 400 may include a first surface 415a forming a part of the outer surface of the electronic device 100, and second surfaces 415b, 415c, and 415d exposed to the inner space of the electronic device 100. According to an embodiment, the first surface 415a may include at least one of the first side surface 401, the second side surface 402, the third side surface 403, or the fourth side surface 404 illustrated in FIG. 4A, which is formed at least partially by the side bezel 410. According to an embodiment, the second surfaces 415b, 415c, and 415d may include surfaces 415b and 415d formed at least partially by the mid-plate 460 (for example, the first area 460a), and a surface 415c formed at least partially by the side bezel 410.

According to an embodiment, the side member 400 (for example, the side bezel 410 or the first area 460a of the mid-plate 460) may be made of a metal material that can form an anodizing layer. An anodizing layer may be formed on the surface of a metal substrate, and the surface of the anodizing layer may be coated with a metal material (for example, through deposition) so as to form the side bezel 410. According to an embodiment, the anodizing layer formed on the metal substrate may include pores which may increase the coupling power between the anodizing layer and the coating layer (or deposition layer).

According to an embodiment, the side member 400 may include an aluminum substrate layer 510 arranged between the first surface 415a and the second surfaces 415b, 415c, and 415d. The side member 400 may include an aluminum oxide layer 520 formed between the first surface 415a and the aluminum substrate layer 510, and the aluminum oxide layer 520 may include a corrugated surface having multiple pores 521 extending in a direction substantially perpendicular to the first surface 415a. The side member 400 may include a first layer 530 formed conformally between the first surface 415a and the aluminum oxide layer 520 along the surface of the aluminum oxide layer 520 and the pores 521. According to an embodiment, the first layer 530 may include at least one material of Cr, Ti, Au, or Si. The side member 400 may include a second layer 540 formed on the first layer 530 so as to form the first surface 415a. According to an embodiment, the second layer 540 may include at least one material of AuCu, CrN, CrCN, TiN, TiCN, ZrN, ZrCN, CrC, CrCN, TiC, TiCN, ZrC, DLC, Cr, Ti, STS, or Si.

According to an embodiment, a part 415d of the second surfaces 415b, 415c, and 415d may be formed by the aluminum substrate layer. For example, a part of the aluminum oxide layer may be removed by using masking, CNC processing, laser etching, or the like such that the second surface 415d is formed by the aluminum substrate layer. As another example, the second surface 415d may be formed such that a partial area of the aluminum substrate layer is not subjected to electroetching.

According to an embodiment, the side member 400 may further include a first conductive pattern 461 arranged on the second surface 415d formed by the aluminum substrate layer 510. According to an embodiment, the first conductive pattern 462 may be used as a contact portion electrically connected to an element (for example, an antenna device) of the electronic device (for example, 300 of FIG. 3). For example, when the printed circuit board (for example, 340 of FIG. 3) is coupled to the side member 400, a flexible conductive member (for example, C-clip or conductive Poron®) formed on the printed circuit board may elastically contact the first conductive pattern 462. According to certain embodiments, the first conductive pattern 462 may be used as an antenna ground. According to certain embodiments, the first conductive pattern 462 may also be used as an electric path (for example, power wire) between elements.

According to an embodiment, parts 415b and 415c of the second surfaces 415b, 415c, and 415d may be formed by the aluminum oxide layer 520. According to an embodiment, the side member 400 may further include a second conductive pattern 463 arranged on the second surface 415b or 415c formed by the aluminum oxide layer 520. For example, the second conductive pattern 463 may be formed by forming a layer including a conductive material on the second surface 415b or 415c and then removing a part of the layer by using masking, CNC processing, laser etching, or the like.

According to an embodiment, the second conductive pattern 463 may be used as an antenna element (for example, an antenna radiator or an antenna ground) of the electronic device (for example, 300 of FIG. 3). For example, when the printed circuit board (for example, 340 of FIG. 3) is coupled to the side member 400, a flexible conductive member (for example, C-clip or conductive Poron®) formed on the printed circuit board may elastically contact the second conductive pattern 463.

According to certain embodiments, the second conductive pattern 463 may be used as an electric path (for example, power wire) between elements.

According to an embodiment, through-holes 457a, 457b, and 457c for key buttons (for example, 117 of FIG. 1 or 117 of FIG. 2) may be arranged on the second bezel portion 410b or the fourth bezel portion 410d. A slot 451 related to a memory card may be arranged on the first bezel portion 410a. At least one of connector holes 452 and 455 (for example, 108 and 109 of FIG. 1), a microphone hole 456 (for example, 103 of FIG. 1), or a speaker hole 453 (for example, 1070 of FIG. 1) may be arranged on the third bezel portion 410c. The arrangement positions of various components positioned on the side bezel 410 described above may be changed to various positions on the first bezel portion 410a, the second bezel portion 410b, the third bezel portion 410c, or the fourth bezel portion 410d.

According to an embodiment, the electronic device (for example, 100 of FIG. 1 or FIG. 2) may include an antenna aligned with at least a part of the second areas 460b and 460c of the mid-plate 460.

According to an embodiment, the mid-plate 460 may include an opening 461 depending on the arrangement of various kinds of components. For example, a battery (for example, 350 of FIG. 3) may be arranged to be aligned with the opening 461, and the opening 461 may provide a space for accommodating battery swelling.

Figure 5:
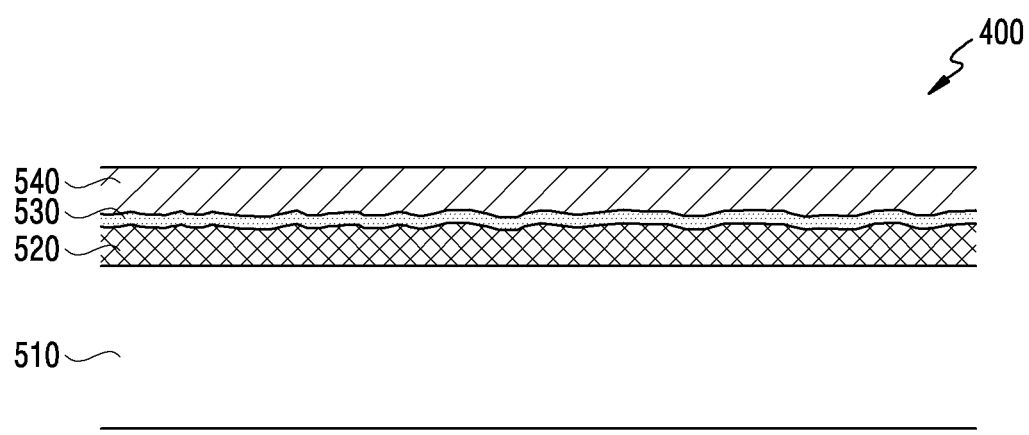
FIG. 5 is a sectional view of a side member according to an embodiment.
Figure 6:
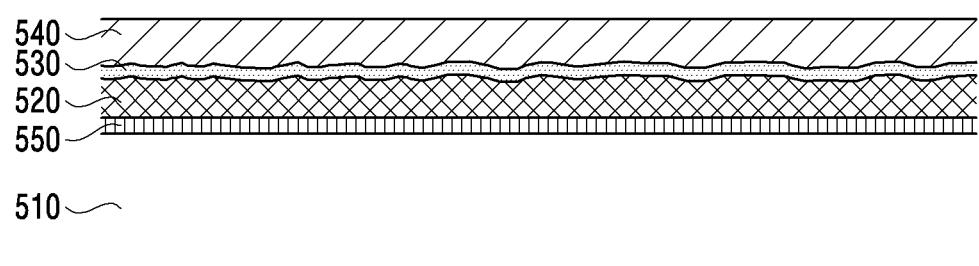
FIG. 6 is a sectional view of a side member according to an embodiment.

FIG. 5 is a sectional view of a housing according to certain embodiments. FIG. 6 is a sectional view of a housing according to certain embodiments.

Referring to FIG. 5, in an embodiment, the side member 400 may include a substrate layer 510, an anodizing layer 520, a bonding layer 530, and a deposition layer 540. The anodizing layer 520 may be formed on the substrate layer 510 through anodizing (or electroetching). The bonding layer 530 may be disposed between the anodizing layer 520 and the deposition layer 540 so as to increase the bond strength between the anodizing layer 520 and the deposition layer 540.

The substrate layer 510 may include (and/or be formed of) a metal material, such as aluminum, magnesium, or titanium, which can form the anodizing layer 520 through anodizing.

According to an embodiment, the anodizing layer 520 may protect the substrate layer 510 from an external environment, providing the side member 400 with resistance to corrosion and resistance to wear. According to certain embodiments, the anodizing layer 520 may be formed to have various thicknesses by changing an operational condition in the anodizing process (for example, temperature, time, electrolyte composition, or electrolyte concentration).

According to certain embodiments, in order to form the anodizing coating layer 520, the side member 400 may be immersed in an electrolyte solution. For example, the electrolyte solution may be an aqueous solution including a strongly acid material such as sulfuric acid ($H_2SO_4$). According to an embodiment, a substrate layer 510 (for example, an aluminum substrate layer) and an anodizing layer 520 (for example, an aluminum oxide layer) may be formed by placing a metal base material (for example, an aluminum member) into a bath containing a sulfuric acid aqueous solution, and then anodizing (electroetching) the same. For example, if the anode of a power supply is connected to the metal base material, and if the cathode of the power supply is connected to the electrolyte solution, anions (i.e., oxygen ions) may be transferred from the electrolyte solution to the metal base material and coupled to metal ions from the metal base material, thereby forming the anodizing layer.

According to an embodiment, the anodizing layer 520 may be formed to have a corrugated surface including a plurality of irregular pores. The corrugated surface having the pores increases coupling power (e.g., bond strength) between the anodizing layer 520 and the deposition layer 540, and may have include shapes depending on the anodizing operation condition (for example, temperature, time, electrolyte composition, or electrolyte concentration). For example, the temperature in the bath may be maintained at the room temperature. For example, the temperature of the sulfuric acid aqueous solution may be about 10-20° C., and the concentration of the sulfuric acid aqueous solution may be about 180-250 g/l. For example, the voltage used for anodizing may be about 13-17V. For example, the anodizing operation time may be about 5-20 minutes.

According to an embodiment, the bonding layer 530 may be applied along the corrugated surface, including the plurality of pores, of the anodizing layer 520, and the interface between the bonding layer 530 and the deposition layer 540 may also be formed in a shape substantially conforming to that of the corrugated surface. The bonding layer 530 may, together with the corrugated surface, increase the coupling power between the anodizing layer 520 and the deposition layer 540. According to an embodiment, it may be desirable to apply the bonding layer 530 at a designed thickness or less such that the interface between the bonding layer 530 and the deposition layer 540 has a shape conforming to that of the corrugated surface.

According to an embodiment, the bonding layer 530 may include various materials having bond strength or adhesive power in order to increase the bond strength with the anodizing layer 520 or the deposition layer 540. According to certain embodiments, the bonding layer 530 may include a material that has bonding affinity with the material included in the anodizing layer 520 or the material included in the deposition layer 540.

According to an embodiment, the bonding layer 530 may be formed by using physical vapor deposition (PVD) and chemical vapor deposition (CVD).

According to an embodiment, in order to form sufficient attachment bond strength with the substrate layer 510 and the deposition layer 540, metal particles made of a pure metal, such as Ti, Cr, or Au, may be attached along the anodizing layer 520. The side member 400 formed by the substrate layer 510 may be arranged in a vacuum chamber, and argon ions may be emitted toward a target made of the metal to be deposited. The argon ions collide with the target, and metal atoms discharged from inside the target are continuously transferred to the substrate layer, thereby forming a bonding layer 530 or a deposition layer 540 along the surface of the anodizing layer 520 including pores. The bonding layer 530 may be formed by conducting a PVD or CVD process using a metal corresponding to metal atoms of the deposition layer 540 as the target metal. According to certain embodiments, not only the above-mentioned sputtering process, but thermal evaporation or electron-beam evaporation may also be used to heat the metal to be deposited such that the deposition material is evaporated, thereby forming the bonding layer 530 and the deposition layer 540 on the substrate layer 510.

According to an embodiment, the deposition layer 540 may be deposited along the surface of the bonding layer 530. The material of the deposition layer 540 may be determined according to the color of the housing 110 exposed to the outside. The deposition layer 540 may be formed by conducting PVD deposition along the surface of the bonding layer 530. The material of the deposition layer 540 may be a compound including atoms of the metal material of the bonding layer 530. According to certain embodiments, metal atoms among the compound of the deposition layer 540 may correspond to the metal material of the bonding layer 530. The deposition layer 540 and the bonding layer 530 have the same metal atoms, thereby increasing the attaching power between the deposition layer 540 and the bonding layer 530. According to certain embodiments, a bonding layer 530 made of a single metal may be deposited on the anodizing layer 520 in order to increase the bond strength between the deposition layer 540 and the anodizing layer 520.

According to an embodiment, in order to increase the attaching power between the substrate layer 510 and the deposition layer 540 of the side member 400, the bonding layer 530 may be formed by using a target made of a single metal such as titanium or chromium. In order to secure the color of the side member 400 to be exposed to the outside, physical characteristics thereof, and the thickness thereof, a target material such as titanium, chromium, or stainless steel is selected, the amount and ratio of gases such as argon, nitrogen, oxygen, and acetylene are adjusted, and the same are injected. In general, when nitrogen gas is injected, a layer made of TiN or CrN may be formed, thereby forming a deposition layer having a yellow-series color; and when acetylene gas is injected, a layer made of TiC, TiCN, CrC, or CrCN may be made, thereby forming a deposition layer having a black-series color.

According to an embodiment, the side member 400 and the target metal may be positioned inside a vacuum chamber. In order to form the bonding layer 530 and the deposition layer 540, voltages are applied to the target made of titanium, chromium, or aluminum and to the side member 400. The voltage applied to the target may be approximately 300 to 500V, and the voltage applied to the side member 400 may be approximately 80 to 120V. By means of the potential difference between the voltages applied to the target and the side member 400, metal particles (for example, metal ions) emitted from the target may be deposited on the side member 400.

According to an embodiment, when the bonding layer 530 is formed on the side member 400, the degree of vacuum in the vacuum chamber may be maintained at $1\times10^{-5}$ Torr or less. Since the bonding layer 530 is formed on the anodizing coating layer 520 of the side member 400 in order to increase the bond strength of the deposition layer 540, the bonding layer 530 may be formed as a thin layer made of at least one element including the metal element forming the deposition layer 540. The material of the target may be selected to be identical to the major metal material of the deposition layer 540.

After the bonding layer 530 is formed, the injected gas may be selected according to the color series of the exterior. When argon gas is injected into the vacuum chamber, the deposition layer 540 may be made of chromium, titanium, or stainless steel, and the deposition layer 540 may be formed to have a silver-series color.

When nitrogen gas is injected into the vacuum chamber, the deposition layer 540 may be made of CrN, TiN, or ZrN, and the deposition layer 540 may be formed to have a gold-series color.

When acetylene ($C_2H_2$) is injected into the vacuum chamber, the deposition layer 540 may be made of CrC, TiC, ZrC, or DLC. Additionally, when nitrogen is injected, the deposition layer 540 may be made of CrCN, TiCN, or ZrCN. When acetylene ($C_2H_2$) is injected, the deposition layer 540 may be formed to have a black-series color. When nitrogen and acetylene gases are injected together, the exterior color of the deposition layer 540 may be adjusted by adjusting the mount of gases.

Referring to FIG. 6, in an embodiment, a color layer 550 may be further included. The color layer may be applied to the surface of the anodizing coating layer 520, and may be applied to the surface after the bonding layer 530 is formed. The color layer 550 may be determined on the basis of the color that is exposed when the coating layer is removed from the product or when the same is scratched. According to certain embodiments, the color layer 550 may have a color belonging to the same series as the color of the deposition layer 540 exposed to the outside.

Figure 7:
FIG. 7 is a sectional view of a housing having an oxide coating formed on a side member according to an embodiment.
Figure 8:
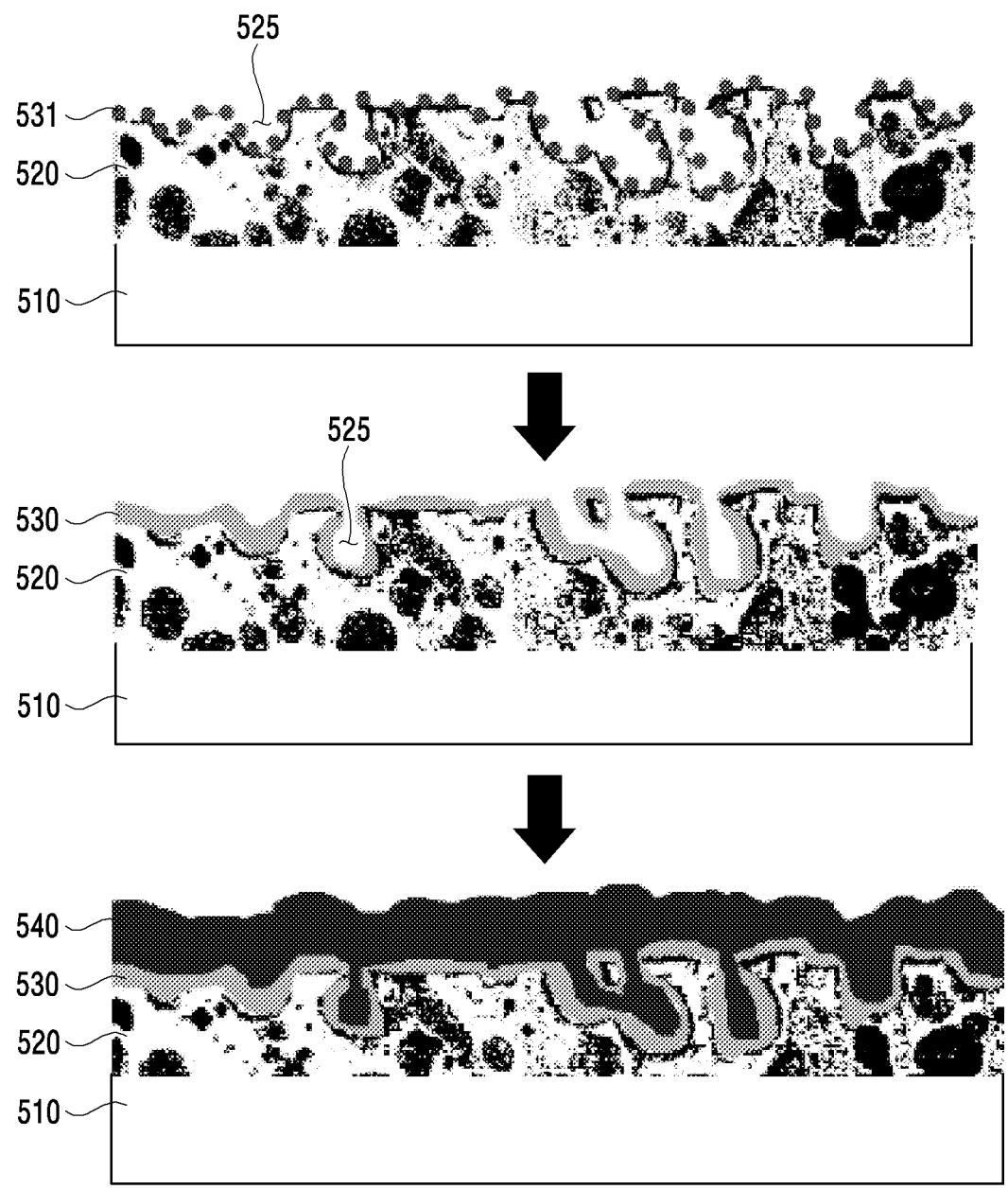
FIG. 8 is a diagram illustrating a process of applying a deposition layer to a side member having an oxide coating formed thereon according to an embodiment.

FIG. 7 is a sectional view of a side member having an oxide coating formed on a substrate layer according to an embodiment. FIG. 8 is a diagram illustrating a process of applying a deposition layer to a side member having an oxide coating formed thereon according to an embodiment.

Referring to FIG. 7, according to an embodiment, the substrate layer 410 of the side member 400 may be made of an anodizable metal (for example, aluminum, magnesium, or stainless steel (STS)). The side member 400 including the substrate layer 410 may be immersed in an electrolyte solution, and the anode of a power supply or a rectifier may be connected to the side member 400 so as to supply a voltage thereto. Oxygen in the electrolyte solution causes a chemical reaction on the surface of the substrate layer 510, and an anodizing coating layer 520 is formed on the surface of the substrate layer 510. The anodizing coating layer 520 formed on the surface of the substrate layer 510 may include a corrugated shape or multiple pores 525. A sealing operation for filling the pores formed on the anodizing coating layer 520 may be omitted. If the sealing operation is not performed, the surface of the anodizing coating layer 520 may include corrugations or pores 525, and the pores 525 or the corrugations increase the surface area of the anodizing coating layer 520.

According to an embodiment, the side member 400 having the anodizing layer 520 formed thereon may have improved resistance to corrosion and may have insulating characteristics. According to certain embodiments, the increased surface area of the anodizing layer 520 results in an anchoring effect, and the bond strength between the bonding layer 530 or the deposition layer 540 may increase accordingly.

Referring to FIG. 8, according to an embodiment, a bonding layer 530 may be formed along the surface of the anodizing layer 520 including pores 525. The bonding layer 530 may be made of a single element and may be formed through a deposition operation.

According to an embodiment, through the deposition operation, fine metal particles 531 may be attached between the pores 525 on the anodizing layer 520. As the fine metal particles 531 are attached to the anodizing layer 520, a bonding layer 530 may be formed on the surface of the anodizing layer 520. The bonding layer 530 may be formed conformally along the surface of the anodizing layer 520. According to certain embodiments, the bonding layer 530 may be formed as a thin coating on the surface of the anodizing layer 520 so as to maintain the shape of the pores 525 or the corrugations of the anodizing layer 520.

According to an embodiment, after the bonding layer 530 is deposited, a deposition layer 540 may be formed so as to form the exterior of the housing or the side member 400. The deposition layer may be formed by selecting the material of the target and the injected gas according to the exterior of the side member 400 and the housing. The bonding layer 530 may be made of a metal corresponding to the material of the deposition layer 540 such that the deposition layer 540 is easily attached to the pores 525 of the anodizing layer 520. Metal particles 531 may be attached to the bonding layer 530 so as to form the deposition layer 540. The material of the deposition layer 540 may be determined by coupling between metal particles 531 discharged from the target and the gas injected into the vacuum chamber.

According to certain embodiments, metal particles 531 may fill the pores 525 of the bonding layer 530, thereby forming a deposition layer 540 having a thickness. Metal particles 531 may be attached inside the micro corrugations or pores 525 on the surface of the anodizing coating layer 520 such that a film is grown, and the resulting structure in which the anodizing coating layer 520, the bonding layer 530, and the deposition layer 540 engage with one another may increase the attaching power.

Figure 9A:
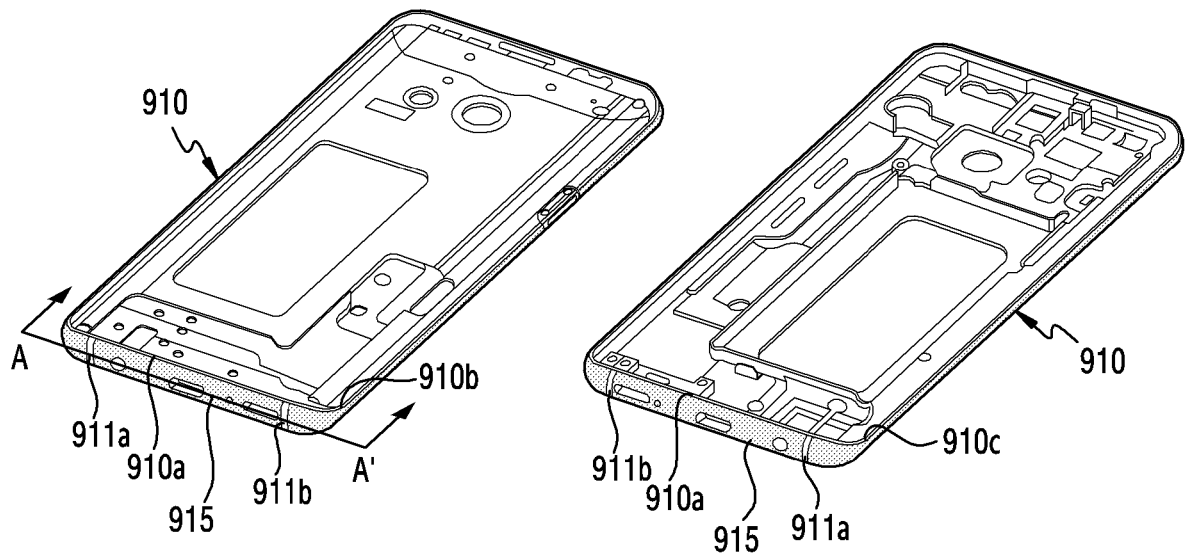
FIG. 9A is a perspective view illustrating a side member having a deposition layer applied thereto according to an embodiment.
Figure 9B:
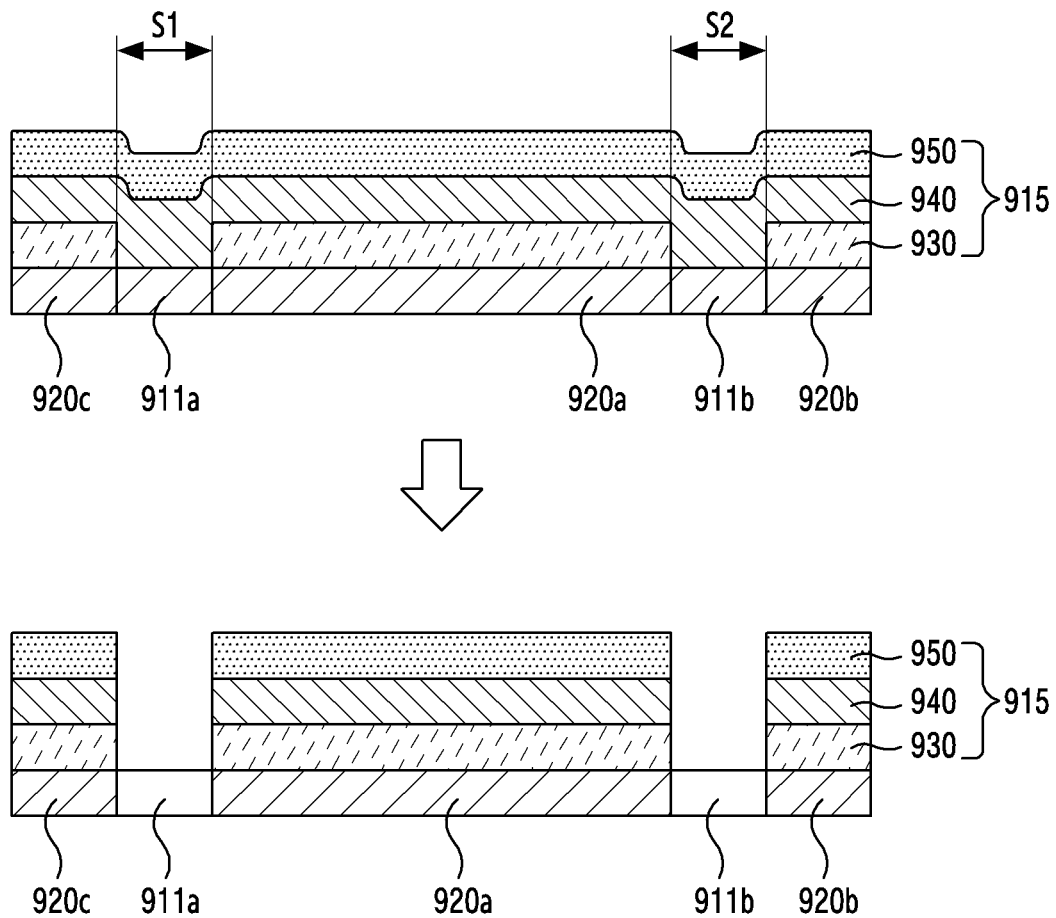
FIG. 9B is a sectional view of a housing taken along A-A' of FIG. 9A according to an embodiment.

FIG. 9A is a perspective view illustrating a side member having a deposition layer applied thereto according to an embodiment. FIG. 9B is a sectional view of a housing taken along A-A' of FIG. 9A according to an embodiment.

Referring to FIG. 9A, according to an embodiment, the side member 400 includes a side bezel 910 and a mid-plate 960. The side bezel 910 may include a first bezel portion 910a, a second bezel portion 910b, a third bezel portion 910c, and a fourth bezel portion (not illustrated), and may further include antenna segment portions 911a and 911b made of a nonmetal member.

According to an embodiment, the antenna segment portions 911a and 911b may be made of a nonmetal material such that a coating layer including an anodizing coating layer and a deposition layer is not formed thereon. The first to fourth metal members 910a may include a coating layer 915 including an anodizing coating layer and a deposition layer. The coating layer 915 formed on the first to fourth bezel portions 910a may enable the color of the deposition layer to be recognized from the outside, and this may enable formation of a housing having a metal texture.

According to an embodiment, the part of the mid-plate 960 made of a metal material may have a coating layer 915 formed thereon, and the part of the mid-plate 960 made of a nonmetal material may have no coating layer formed thereon such that the nonmetal material is exposed to the outside. From each part of the mid-plate 960, the coating layer including the deposition layer and the anodizing coating may be removed according to the function thereof. According to certain embodiments, if desirable, the deposition layer may be selectively removed, and the entire coating layer 915 may be removed. The mid-plate 960 may include an antenna pattern portion, a terminal portion, or a conductive printed circuit function portion.

Referring to FIG. 9B, one corner of the side bezel 910 may be formed to include a first metal member 920a, a second metal member 920b, a third metal member 920c, and antenna segment portions 911a and 911b. The first metal member 920a, the second metal member 920b, and the third metal member 920c may be the substrate metal of the first bezel portion 910a, the second bezel portion 910b, and the third bezel portion 910c. The antenna segment portions 911a and 911b are made of a nonmetal material such that no anodizing layer 930 is formed thereon, and an anodizing layer 930 is formed on the metal members 920a, 920b, and 920c of the first bezel portion 910a, the second bezel portion 910b, and the third bezel portion 910c. The bonding layer 940 and the deposition layer 950 may also be formed on the antenna segment portions 911a and 911b on which no anodizing layer 930 is formed.

According to an embodiment, the antenna performance may undergo deterioration because the bonding layer 940 and the deposition layer 950 are made of metal materials. The bonding layer 940 and the deposition layer 950 formed in areas S1 and S2 overlapping the antenna segment portions 911a and 911b may be removed through a laser hatching or cutting process. According to an embodiment, the areas S1 and S2 overlapping the antenna segment portions 911a and 911b may be masked before or after formation of the anodizing layer such that the bonding layer 940 and the deposition layer 950 are not formed.

Figure 10A:
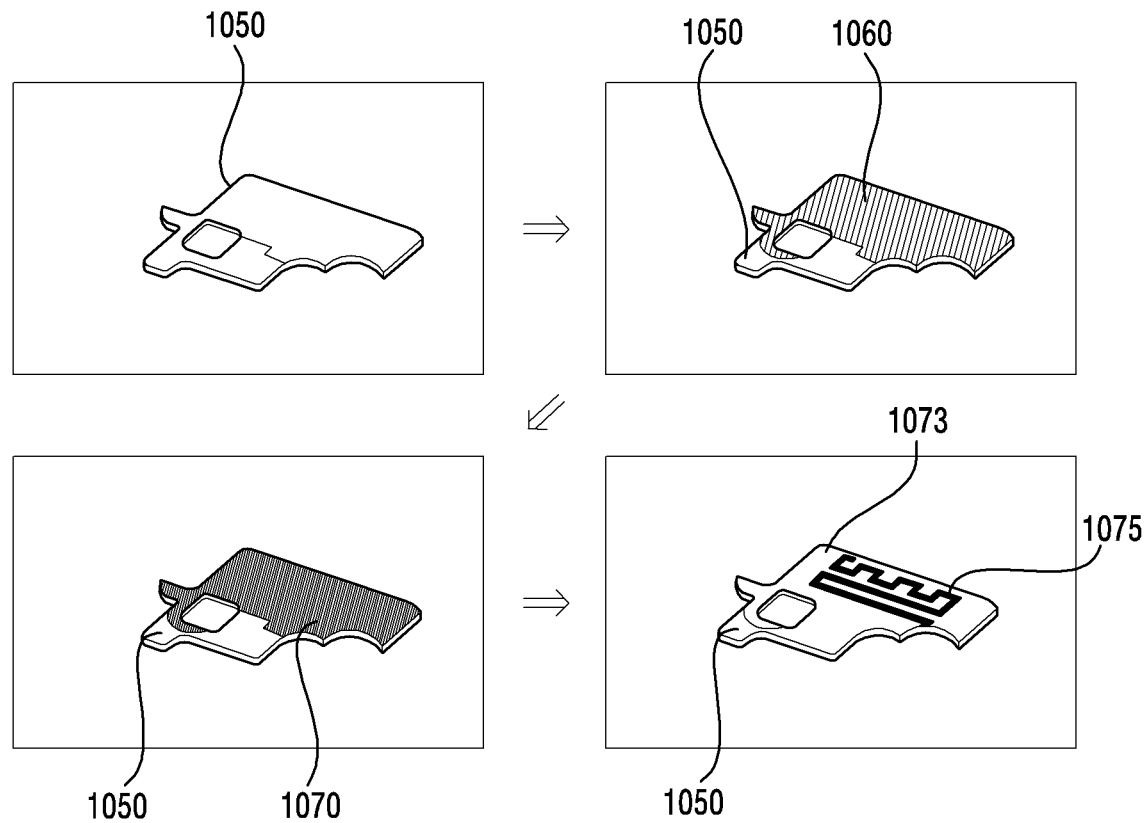
FIG. 10A is a diagram illustrating a flow of forming an antenna pattern portion according to an embodiment.
Figure 10B:
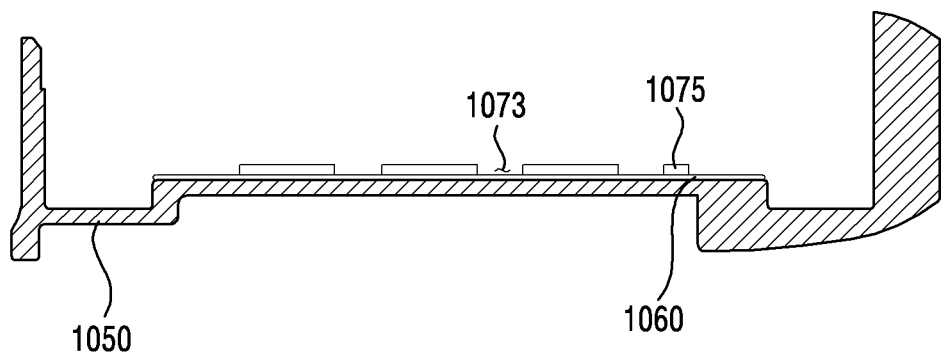
FIG. 10B is a sectional view of the antenna pattern portion of FIG. 10A according to an embodiment.

FIG. 10A is a diagram illustrating a process of forming an antenna pattern portion according to an embodiment. FIG. 10B is a sectional view of the antenna pattern portion of FIG. 10A according to an embodiment.

Referring to FIG. 10A, according to an embodiment, the antenna pattern portion 1050 may include an antenna pattern 1075. The antenna pattern portion 1050 may be formed on a part of the mid-plate 960. The mid-plate 960, on which the antenna pattern portion 1050 is to be formed, may have a substrate layer 1055 made of an anodizable metal. An anodizing coating layer 1060 and a deposition layer 1070 may be successively deposited in the area of the antenna pattern portion 1050, in which the antenna pattern 1075 is to be formed.

Referring to FIG. 10B, according to an embodiment, the antenna pattern portion 1050 may include a substrate layer 1055, an anodizing coating layer 1060, a deposition layer 1070, and a coating layer removal area 1073. A masking may be formed in an area of the antenna pattern portion 1050, in which the anodizing coating layer 1060 and the deposition layer 1070 are unnecessary, and the masking may be removed after the coating layer is completed, thereby forming a pattern. According to certain embodiments, an antenna pattern 1075 may be formed on parts of the antenna pattern portion 1050, on which the anodizing coating layer 1060 and the deposition layer 1070 are formed, through laser hatching. Since the deposition layer may be made of a metal material, the antenna pattern 1075 may have conductivity.

According to an embodiment, the antenna pattern 1075, which has conductivity, may be used as a conductive line functioning as a printed circuit board. According to certain embodiments, a printed circuit board including a conductive line may be directly formed on the mid-plate 960 by distinguishing a nonconductive area and a conductive area. According to certain embodiments, the conductive line of the printed circuit board and the antenna pattern 1075 may be simply formed in the coating process of the side member 900.

Figure 11:
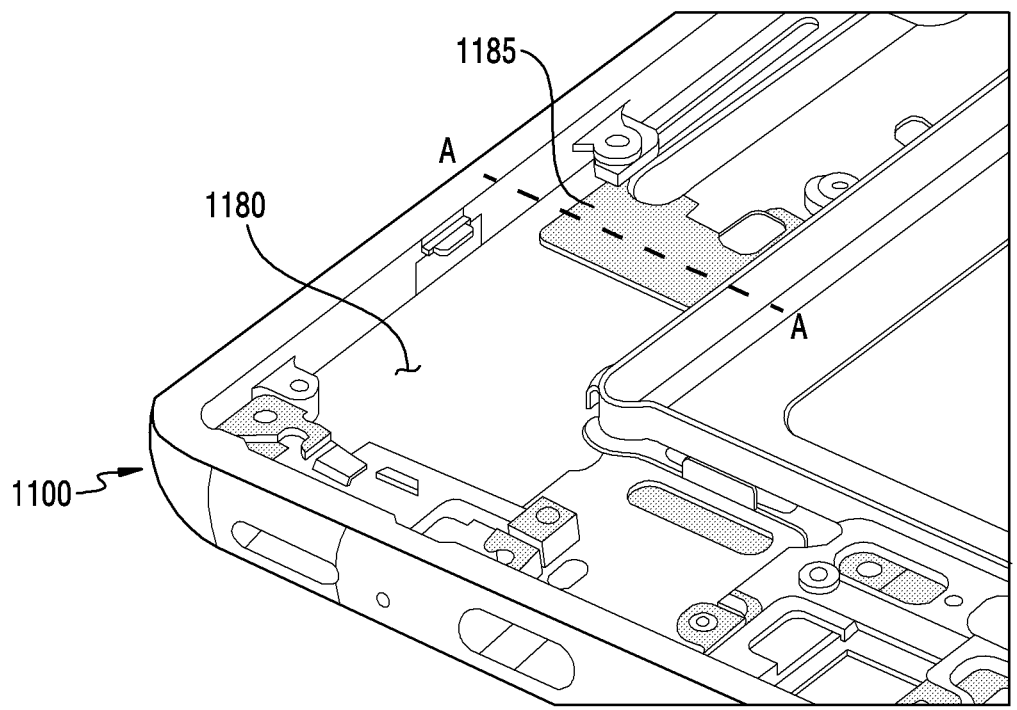
FIG. 11 is a diagram illustrating a terminal portion, the deposition layer of which is visible, in connection with a housing according to certain embodiments.
Figure 11:
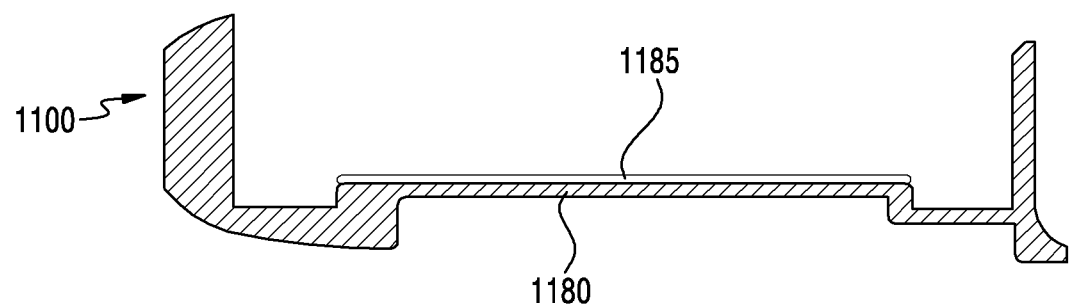

FIG. 11 is a diagram illustrating a terminal portion, the deposition layer of which is visible, in connection with a housing according to certain embodiments.

Referring to FIG. 11, according to an embodiment, the mid-plate 1180 may further include a terminal portion 1185. The mid-plate 1180 on which the terminal portion 1185 is formed may be made of a metal material. Since an anodizing coating layer may be formed on the entire side member 1100, the anodizing coating layer needs to be removed. The anodizing coating layer may be removed through CNC processing or laser processing after a coating layer is formed on the side member 1100. According to certain embodiments, a masking may be formed in an area of the side member 1100, in which the terminal portion 1185 is to be formed, and the masking may be removed after the anodizing coating layer is formed, such that a deposition layer is deposited on the terminal portion 1185.

Referring to the sectional view taken along A-A' of FIG. 11, the terminal portion 1185 may be directly formed on the surface of the mid-plate 1180. The mid-plate 1180 on which the terminal portion 1185 is formed may be made of a metal material. Since the terminal portion 1185 needs to be electrically connected to an antenna structure (not illustrated), the anodizing coating that has nonconductivity needs to be removed. When a deposition layer made of metal particles is deposited on the terminal portion 1185, from which the anodizing coating has been removed, through a deposition operation, the terminal portion 1185 may be electrically connected to the antenna structure.

Figure 12:
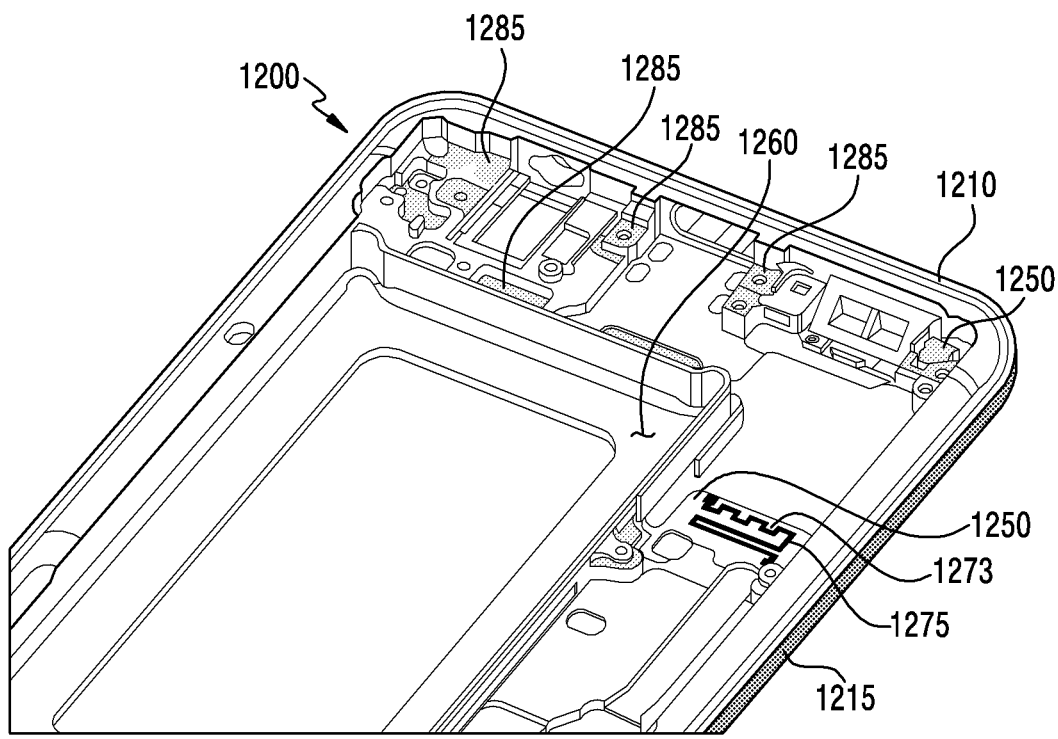
FIG. 12 is a perspective view of a housing according to another embodiment.

FIG. 12 is a perspective view of a housing according to another embodiment.

Referring to FIG. 12, the side member 1200 may include a side bezel 1210 and a mid-plate 1260. An anodizing coating layer may be formed in an area of the side member 1200, which is made of a metal material. Hereinafter, a process of forming a coating layer on the side member made of a metal material, excluding the area thereof made of a nonmetal material.

According to certain embodiments, a deposition layer may be exposed to the side surface 1215 of the side bezel 1210, which is exposed to the outside, and an anodizing coating layer may be exposed to most areas of the mid-plate 1260. An anodizing coating layer may be formed on the side member 1200 as a whole. The side member 1200 may be immersed in an electrolyte solution such that an anodizing coating layer is formed on the surface of the side member 1200.

According to certain embodiments, a deposition layer may be formed in a partial area of the mid-plate 1260. The deposition layer may be exposed to the outside through the terminal portion 1285 and the antenna pattern portion 1250 among the mid-plate 1260.

According to certain embodiments, the antenna pattern portion 1250 may include a coating layer having a deposition layer applied onto the anodizing coating layer. Through laser engraving of the coating layer, the coating layer may be left in the area of the antenna pattern 1275, and the coating layer may be removed from the remaining area 1273 of the antenna pattern portion 1250. As a method for forming the antenna pattern 1275, an area functioning as a printed circuit board may be formed in an area that utilizes a conductive line. According to certain embodiments, before the anodizing coating layer is generated, a masking may be formed in the remaining area 1273 of the antenna pattern portion 1250, and the masking may be removed after the coating layer is formed such that the antenna pattern portion 1250 has an antenna pattern 1275 formed thereon.

According to certain embodiments, the terminal portion 1285 may have a deposition layer formed directly on the substrate layer of the mid-plate 1260. An electronic component may be mounted on the mid-plate 1260, and the terminal portion 1285 may have a deposition layer formed on a substrate layer made of a metal so as to be electrically connected to an electronic component contacting the terminal portion 1285.

According to certain embodiments, the terminal portion 1285 may be removed after an anodizing coating layer is formed, or the anodizing coating layer may not be formed through masking before the anodizing coating layer is formed. Thereafter, a deposition layer may be directly formed on a metal material through a PVD process.

According to certain embodiments, the side member 1200 may selectively expose the deposition layer and the oxide coating layer according to the function of each area, and the deposition layer may be directly formed on the substrate layer without the oxide coating layer, thereby simplifying the process.

Figure 13:
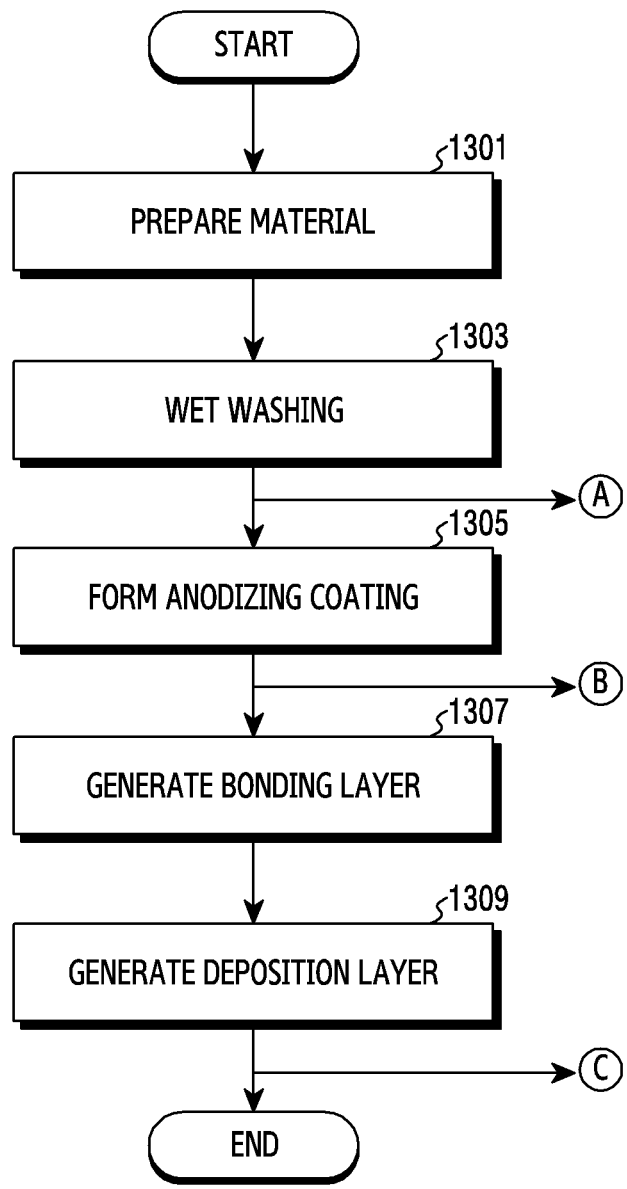
FIG. 13 is a flowchart for manufacturing a housing according to certain embodiments.
Figure 14:
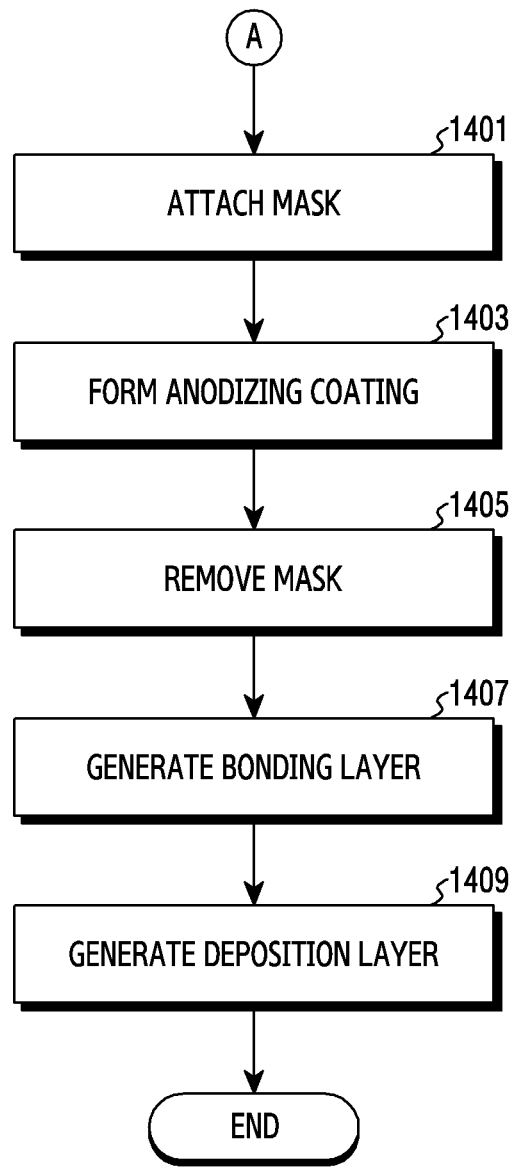
FIG. 14 is a flowchart for manufacturing a housing according to certain embodiments.
Figure 15:
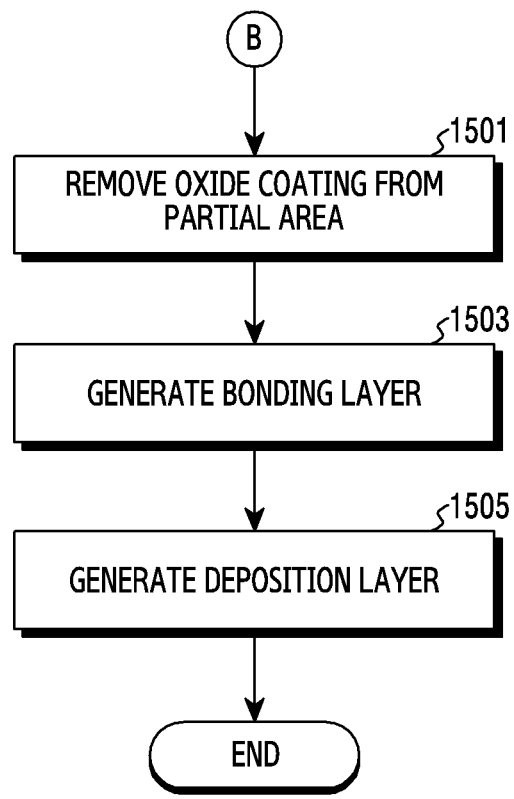
FIG. 15 is a flowchart for manufacturing a housing according to certain embodiments.
Figure 16:
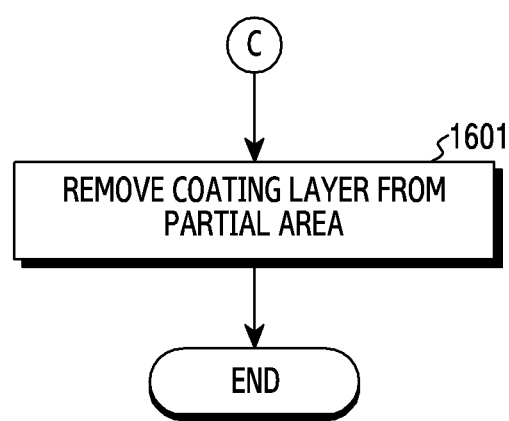
FIG. 16 is a flowchart for manufacturing a housing according to certain embodiments.

FIG. 13 is a flowchart illustrating a method for manufacturing a housing according to certain embodiments. FIG. 14 is a flowchart illustrating a method for manufacturing a housing according to certain embodiments. FIG. 15 is a flowchart illustrating a method for manufacturing a housing according to certain embodiments. FIG. 16 is a flowchart illustrating a method for manufacturing a housing according to certain embodiments.

Referring to FIG. 13, in operation 1301, a material may be prepared. In operation 1301, the final shape of a side member 1200 may be completed through cutting processing or laser processing, and the processed surface may be polished to prepare the side member 1200.

In operation 1303, the prepared material (for example, the side member 1200) may undergo wet washing. In operation 1303, alien substances attached to the processed surface may be removed, and wet washing may be conducted to form an anodizing layer.

In operation 1305, an anodizing coating may be formed on the metal material that has undergone wet washing. In operation 1305, the side member 1200 may be immersed in a diluted electrolyte solution such as a sulfuric acid aqueous solution, and the anode of a power supply or a rectifier may be applied to the side member 1200, thereby forming an anodizing coating layer on the side member 1200. The anodizing coating layer formed on the side member 1200 may include a corrugated shape or various pores. The irregular pores formed on the anodizing coating layer may increase the exposed surface area and may cause the anodizing coating layer to hold the deposition layer, thereby increasing the attaching power with the deposition layer.

In operation 1307, after forming the anodizing coating on the side member 1200, a step of generating a bonding layer on the surface of the anodizing layer (S1307) may be conducted. The bonding layer may be formed to increase the bond strength between the anodizing coating layer and the deposition layer. Metal particles may be bonded between pores formed on the surface of the anodizing coating layer such that the bonding layer is formed conformally along the shape of the pores.

In operation 1309, a deposition layer may be generated on the surface of the anodizing coating layer having the bonding layer formed thereon. The final coating on the side member 1200 may be completed by conducting operation 1309.

Referring to FIG. 14, the method for forming a coating layer on the housing may further include a process of forming a terminal portion 1285 on the mid-plate 1260. According to the process of forming the terminal portion 1285, a masking may be formed after wet washing, and the masking may be removed after forming an anodizing coating. The following operations may proceed similarly to those of FIG. 13.

In operation 1401, a masking may be formed on the surface of the side member 1200 that has undergone wet washing. The area in which the masking is formed may be an area that requires no anodizing coating layer. Since the anodizing coating layer has nonconductivity, the anodizing coating layer may interfere with electric connection in an area used as a terminal portion of an electronic component. According to certain embodiments, no anodizing coating layer may be formed on a part that functions as a terminal portion 1285 such that an electronic component can be electrically connected. The part used as the terminal portion of the electronic component may expose a metal member to the outside, and may have a deposition layer formed thereon so as to increase resistance to corrosion and resistance to wear.

In operation 1403, an anodizing coating may be formed on the entire surface of the side member 1200, on which a masking is formed. Even when the anodizing coating is formed on the entire side member 1200, the anodizing coating layer may not be formed in an area made of a nonmetal member and in an area having a masking formed therein.

In operation 1405, the masking may be removed after the anodizing layer is formed. According to certain embodiments, the masking may be removed so as to directly expose the metal material layer, instead of the anodizing coating layer, and a bonding layer and a deposition layer may be formed on the surface of the metal material layer (1407 and 1409).

Referring to FIG. 15, in order to form a terminal portion 1285, the formed anodizing coating may be removed, and a deposition layer may be directly formed on the metal material.

In operation 1501, the anodizing coating layer may be removed from the area corresponding to the terminal portion 1285 through a CNC processor or laser hatching (1501). Thereafter, operations of generating a bonding layer and a deposition layer may proceed similarly to the steps mentioned with reference to FIG. 13, including the generation of a boding layer (1503) and generation of a deposition layer (1505), further details of which will be omitted.

Referring to FIG. 16, a process of forming an antenna pattern or a conductive line is illustrated.

In operation 1601, a pattern may be formed through laser engraving in a partial area of the deposition layer of the mid-plate 1260 formed finally (for example, the antenna pattern portion 1250 of the mid-plate 1260 in FIG. 12, or the first segment portion 911*a* and the second segment portion 911*b* in FIG. 9B). Since the deposition layer is made of metal particles and has conductivity, an antenna pattern 1275 or a pattern that may form a conductive line and have the same function as that of a printed circuit board may be formed on the mid-plate 1260.

According to an embodiment, the deposition layer may also be formed on a nonconductive member formed in an antenna area, such as a segment portion. Since the deposition layer is made of a metal material, a laser may be used to remove the deposition layer made of a metal material, which is formed in an area made of a nonconductive member (for example, an antenna segment portion (segment portions 411a and 411b of FIG. 4)), in order to secure antenna radiation performance.

As described above, an electronic device according to certain embodiments may have an anodizing coating layer formed on a metal material, and may have a deposition layer formed thereon so as to form the final exterior. The coating layer formed on the side member or the housing may undergo laser etching or the like such that the anodizing coating layer, the substrate layer, or the coating layer is selectively exposed. According to certain embodiments, formation of an anodizing coating or a deposition layer on an applied or bonded part is prevented by various processes using a masking, such as an adhesive, a film, a tape, printing, and painting, such that the exposed surface can be selected according to the function.

As described above, an electronic device according to certain embodiments may include: a first plate; a second plate facing in an opposite direction to the first plate; a side member coupled to or integrally formed with the second plate, the side member surrounding a space between the first plate and the second plate; and a mid-plate coupled to or integrally formed with the side member, the mid-plate extending into the space. The side member may include: an aluminum substrate layer formed between a first surface forming a part of an outer surface of the electronic device and a second surface exposed into the space; an aluminum oxide layer formed between the first surface and the aluminum substrate layer, the aluminum oxide layer including multiple pores extending in a direction substantially perpendicular to the first surface; a first layer formed conformally between the first surface and the aluminum oxide layer along the pores and a surface of the aluminum oxide layer, the first layer including titanium; and a second layer formed on the first layer so as to form the first surface, the second layer including titanium.

According to certain embodiments, the second surface may be formed on the substrate layer as an aluminum oxide layer.

According to certain embodiments, a part of the mid-plate may include an aluminum substrate layer, and a conductive member may make an electric contact with the aluminum substrate layer.

According to certain embodiments, the first layer may be made of a material including at least one of Cr, Ti, Au, or Si.

According to certain embodiments, the second layer may be made of a material including at least one of AuCu, CrN, CrCN, TiN, TiCN, ZrN, ZrCN, CrC, CrCN, TiC, TiCN, ZrC, DLC, Cr, Ti, STS, or Si.

A housing according to certain embodiments may include: a plate forming a surface of the housing; and a side member arranged along a periphery of the plate so as to form a side surface of the housing, the side member including a mid-plate extending from the side surface to an inner space. The side member may include: a nonconductive member forming a part of the side member; a substrate layer forming a remaining part of the side member, the substrate layer being made of an anodizable metal; an anodizing coating layer having multiple irregular pores formed by oxidation of a partial surface of the substrate layer; a bonding layer formed along a surface of the anodizing coating layer, the surface including the irregular pores; and a deposition layer deposited on the bonding layer so as to fill the pores.

According to certain embodiments, the substrate layer may be made of at least one of aluminum or magnesium.

According to certain embodiments, the mid-plate may have a pattern formed by partially delaminating the deposition layer and the bonding layer in at least one area.

According to certain embodiments, the pattern may be formed by a laser engraving or computer numerical control (CNC) process.

According to certain embodiments, the pattern may be at least one of an antenna pattern or a conductive printed circuit.

According to certain embodiments, at least one of the substrate layer or the anodizing layer may be exposed to a surface of a remaining area of the mid-plate.

According to certain embodiments, a masking may be formed in the remaining area of the mid-plate before the anodizing coating layer is formed or before the deposition layer is formed.

According to certain embodiments, the substrate layer may be exposed to a partial surface of a remaining area of the mid-plate, and the deposition layer is formed on the exposed substrate layer.

According to certain embodiments, the deposition layer formed on the exposed substrate layer may be electrically connected to an electronic component.

According to certain embodiments, the anodizing coating layer may be formed by introducing the second plate and the mid-plate into an electrolyte solution and applying a voltage to the second plate and the mid-plate as an anode.

According to certain embodiments, the bonding layer may be made of a material including at least one of Cr, Ti, Au, or Si.

According to certain embodiments, the deposition layer may be made of a material including at least one of AuCu, CrN, CrCN, TiN, TiCN, ZrN, ZrCN, CrC, CrCN, TiC, TiCN, ZrC, DLC, Cr, Ti, STS, or Si.

A housing manufacturing method according to certain embodiments may include the steps of: preparing a substrate including a mid-plate formed on a surface and a side surface of a housing and inside the side surface; forming an anodizing coating by connecting the substrate to an anode of a power supply and immersing the substrate in an electrolyte solution; forming a bonding layer along a surface of the anodizing coating, the surface including multiple pores; and filling the pores and forming a deposition layer on the bonding layer.

According to certain embodiments, the housing manufacturing method may further include a step of forming a conductive pattern through laser engraving in at least a partial area of the mid-plate.

According to certain embodiments, the housing manufacturing method may further include a step of removing the anodizing coating from at least a partial area of the mid-plate before the forming a bonding layer.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to certain embodiments thereof, it will be understood by those skilled in the art that various changes in form and details may be made therein without departing from the spirit and scope of the disclosure as defined by the appended claims and their equivalents.

What is claimed is:

1. An electronic device, comprising:
a first plate;
a second plate facing an opposite direction relative to the first plate;
a side member coupled to or integrally formed with the second plate, the side member surrounding a space between the first plate and the second plate; and
a mid-plate coupled to or integrally formed with the side member, the mid-plate extending into the space, wherein the side member further comprises:
an aluminum substrate layer formed between a first surface forming a part of an outer surface of the electronic device and a second surface exposed within the space,
an aluminum oxide layer formed between the first surface and the aluminum substrate layer, the aluminum oxide layer comprising multiple pores extending in a direction substantially perpendicular to the first surface,
a first layer formed conformally between the first surface and the aluminum oxide layer along the multiple pores and a surface of the aluminum oxide layer, the first layer comprising titanium, and
a second layer formed on the first layer as to form the first surface, the second layer comprising titanium.

2. The electronic device of claim 1, wherein the second surface is formed on the aluminum substrate layer as an aluminum oxide layer.

3. The electronic device of claim 1, wherein a portion of the mid-plate comprises an aluminum substrate layer, and a conductive member electrically contacts the aluminum substrate layer.

4. The electronic device of claim 1, wherein the first layer is formed of a material comprising at least one of Cr, Ti, Au, or Si.

5. The electronic device of claim 1, wherein the second layer is formed of a material comprising at least one of AuCu, CrN, CrCN, TiN, TiCN, ZrN, ZrCN, CrC, CrCN, TiC, TiCN, ZrC, DLC, Cr, Ti, STS, or Si.

6. A housing for an electronic device, comprising:
a plate forming a surface of the housing; and
a side member arranged along a periphery of the plate so as to form a side surface of the housing, the side member comprising a mid-plate extending from the side surface to an interior space defined at least partly by the plate, wherein the side member comprises:
a nonconductive member forming a first part of the side member,
a substrate layer forming a second part of the side member, the substrate layer formed of an anodizable metal;
an anodizing coating layer including multiple irregular pores formed by oxidation of at least a partial surface of the substrate layer;
a bonding layer formed along a surface of the anodizing coating layer, the surface comprising the multiple irregular pores; and
a deposition layer deposited on the bonding layer so as to fill the multiple irregular pores.

7. The housing of claim 6, wherein the substrate layer is formed of at least one of aluminum or magnesium.

8. The housing of claim 6, wherein the mid-plate includes a pattern formed by partially delaminating the deposition layer and the bonding layer in at least one area.

9. The housing of claim 8, wherein the pattern is formed by a laser engraving or computer numerical control (CNC) process.

10. The housing of claim 8, wherein the pattern includes at least one of an antenna pattern or a conductive printed circuit.

11. The housing of claim 6, wherein at least one of the substrate layer or the anodizing coating layer is exposed to a surface of a remaining area of the mid-plate.

12. The housing of claim 11, wherein a masking is formed in the remaining area of the mid-plate before the anodizing coating layer is formed or before the deposition layer is formed.

13. The housing of claim 6, wherein the substrate layer is exposed to a partial surface of a remaining area of the mid-plate, and the deposition layer is formed on the exposed substrate layer.

14. The housing of claim 13, wherein the deposition layer formed on the exposed substrate layer is electrically coupled to an electronic component.

15. The housing of claim 6, wherein the anodizing coating layer is formed by introducing a second plate and the mid-plate into an electrolyte solution and applying a voltage to the second plate and the mid-plate for operation as an anode.

16. The housing of claim 6, wherein the bonding layer is formed of a material comprising at least one of Cr, Ti, Au, or Si.

17. The housing of claim 6, wherein the deposition layer is formed of a material comprising at least one of AuCu, CrN, CrCN, TiN, TiCN, ZrN, ZrCN, CrC, CrCN, TiC, TiCN, ZrC, DLC, Cr, Ti, STS, or Si.

18. A housing manufacturing method, comprising:
preparing a substrate including a mid-plate formed on a surface and a side surface of a housing, the substrate disposed inside the side surface;
forming an anodizing coating by connecting the substrate to an anode of a power supply and immersing the substrate in an electrolyte solution;
forming a bonding layer along a surface of the anodizing coating, the surface comprising multiple pores; and
filling the pores and forming a deposition layer on the bonding layer.

19. The housing manufacturing method of claim 18, further comprising forming a conductive pattern through laser engraving on at least a partial area of the mid-plate.

20. The housing manufacturing method of claim 18, further comprising removing the anodizing coating from at least a partial area of the mid-plate before formation of the bonding layer.

* * * * *